(12) United States Patent
Yilmaz

(10) Patent No.: US 7,427,800 B2
(45) Date of Patent: Sep. 23, 2008

(54) SEMICONDUCTOR DEVICE CONTAINING DIELECTRICALLY ISOLATED PN JUNCTION FOR ENHANCED BREAKDOWN CHARACTERISTICS

(76) Inventor: Hamza Yilmaz, 20755 Trinity Ave., Saratoga, CA (US) 95070

( * ) Notice: Subject to any disclaimer, the term of this patent is extended or adjusted under 35 U.S.C. 154(b) by 0 days.

(21) Appl. No.: 10/987,761

(22) Filed: Nov. 12, 2004

(65) Prior Publication Data

US 2005/0167744 A1 Aug. 4, 2005

Related U.S. Application Data

(62) Division of application No. 10/771,593, filed on Feb. 2, 2004.

(51) Int. Cl.
*H01L 29/80* (2006.01)
(52) U.S. Cl. .............. 257/488; 257/E29.014; 438/140
(58) Field of Classification Search ......... 257/488–491, 257/494–495, E29.008, E29.014, E29.023, 257/29.022; 438/140
See application file for complete search history.

(56) References Cited

U.S. PATENT DOCUMENTS

| | | | | |
|---|---|---|---|---|
| 4,957,881 | A * | 9/1990 | Crotti | 438/631 |
| 5,168,331 | A * | 12/1992 | Yilmaz | 257/331 |
| 5,216,275 | A | 6/1993 | Chen | 257/493 |
| 5,233,215 | A * | 8/1993 | Baliga | 257/490 |
| 5,244,823 | A | 9/1993 | Adan | 438/291 |
| 5,349,224 | A | 9/1994 | Gilbert et al. | 257/333 |
| 5,859,466 | A * | 1/1999 | Wada | 257/508 |
| 5,960,277 | A | 9/1999 | Blanchard | 438/234 |
| 6,342,709 | B1 * | 1/2002 | Sugawara et al. | 257/139 |
| 6,590,240 | B1 * | 7/2003 | Lanois | 257/256 |
| 6,600,193 | B2 * | 7/2003 | Darwish | 257/330 |
| 6,635,534 | B2 | 10/2003 | Madsen | 438/270 |

(Continued)

FOREIGN PATENT DOCUMENTS

EP 1073110 A1 1/2001 ................. 21/329

(Continued)

OTHER PUBLICATIONS

Wolf et al., Silicon Processing for the VLSI Era Volume 1: Process Technology, Lattice Press, pp. 268-269, 2000.*

(Continued)

*Primary Examiner*—Lex Malsawma
*Assistant Examiner*—William F Kraig
(74) *Attorney, Agent, or Firm*—Patentability Associates

(57) ABSTRACT

A semiconductor device includes a field shield region that is doped opposite to the conductivity of the substrate and is bounded laterally by dielectric sidewall spacers and from below by a PN junction. For example, in a trench-gated MOSFET the field shield region may be located beneath the trench and may be electrically connected to the source region. When the MOSFET is reverse-biased, depletion regions extend from the dielectric sidewall spacers into the "drift" region, shielding the gate oxide from high electric fields and increasing the avalanche breakdown voltage of the device. This permits the drift region to be more heavily doped and reduces the on-resistance of the device. It also allows the use of a thin, 20 Å gate oxide for a power MOSFET that is to be switched with a 1V signal applied to its gate while being able to block over 30V applied across its drain and source electrodes, for example.

15 Claims, 16 Drawing Sheets

U.S. PATENT DOCUMENTS

| | | | |
|---|---|---|---|
| 6,750,507 B2 * | 6/2004 | Williams et al. | 257/328 |
| 7,038,260 B1 | 5/2006 | Yo | 257/287 |
| 7,132,712 B2 | 11/2006 | Kocon et al. | 257/328 |
| 2002/0030237 A1 | 3/2002 | Omura et al. | 257/397 |
| 2003/0020102 A1 * | 1/2003 | Gajda | 257/244 |
| 2003/0096464 A1 | 5/2003 | Lanois | 438/173 |
| 2004/0031987 A1 | 2/2004 | Henninger et al. | 257/328 |
| 2004/0084721 A1 * | 5/2004 | Kocon et al. | 257/328 |
| 2005/0118837 A1 * | 6/2005 | Todd et al. | 438/791 |
| 2005/0167695 A1 | 8/2005 | Yilmaz | 257/331 |
| 2005/0167742 A1 * | 8/2005 | Challa et al. | 257/328 |
| 2005/0169041 A1 * | 8/2005 | Wang | 365/154 |
| 2005/0173758 A1 | 8/2005 | Peake et al. | 257/330 |
| 2006/0001084 A1 * | 1/2006 | Kelly et al. | 257/329 |
| 2006/0049453 A1 | 3/2006 | Schmitz et al. | 257/330 |

FOREIGN PATENT DOCUMENTS

| | | | |
|---|---|---|---|
| EP | 1369927 A2 | 12/2003 | 29/78 |
| JP | 07142713 | 6/1995 | 29/78 |
| JP | 08102538 | 4/1996 | 29/78 |

OTHER PUBLICATIONS

Jongdae Kim et al., "High-Density Trench DMOSFETs Employing Two Step Trench Technique and Trench Contact Structure", ISPSD-2003 Proceedings, pp. 1-4, no month cited.

Il-Yong Park et al., "Novel Process Techniques for Fabricating High Density Trench MOSFETs with Self-Aligned N+/P+ Source Formed on the Trench Side Wall", ISPSD-2003 Proceedings, pp. 1-4, no month cited.

M.A.A. In 'tZandt, et al., "Record-low 4mΩ mm² specific on-resistance for 20V Trench MOSFETs", ISPSD-2003 Proceedings, pp. 1-4, no month cited.

Mohammed Darwish et al., "A New Power W-Gated Trench MOSFET (WMOSFET) with High Switching Performance", ISPSD-2003 Proceedings, pp. 1-4, no month cited.

Syotaro Ono et al., "30V New Fine Trench MOSFET with Ultra Low On-Resistance", ISPSD-2003 Proceedings, pp. 1-4, no month cited.

Gupta, R.N. et al., A Novel Planarized, Silicon Trench Silicon Trench Sidewall Oxide-Merged p-i-n Schottky (TSOX-MPS) Rectifier, IEEE Electron Device Letters, vol. 20, No. 12, Dec. 1999.

Chang, H.R. et al., Development and Demonstration of Silicon Carbide (SiC) Motor Drive Inverter Modules, 2003 IEEE 34th Annual Power Electronics Specialists Conference (PESC) Conference Proceedings, Acapulco, Mexico, Jun. 15, 2003.

Kim et al., "High-Density Trench DMOSFETs Employing Two Step Trench Technique and Trench Contact Structure", ISPSD-2003 Proceedings, no month cited.

Il-Yong Park et al., "Novel Process Techniques for Fabricating High Density Trench MOSFETs with Self-Aligned N+/P+ Source Formed on the Trench Side Wall", ISPSD-2003 Proceedings, no month cited.

M.A.A. In 'tZandt. et al., "Record-low 4mΩ mm² specific on-resistance for 20V Trench MOSFETs", ISPSD-2003 Proceedings, no month cited.

Mohammed Darwish et al., "A New Power W-Gated Trench MOSFET (WMOSFET) with High Switching Performance", ISPSD-2003 Proceedings, no month cited.

Syotaro Ono et al., "30V New Fine Trench MOSFET with Ultra Low On-Resistance", ISPSD-2003 Proceedings, no month cited.

* cited by examiner

SEMICONDUCTOR DEVICE CONTAINING DIELECTRICALLY ISOLATED PN JUNCTION FOR ENHANCED BREAKDOWN CHARACTERISTICS

FIELD OF THE INVENTION

This invention relates to semiconductor device structures with improved packing/cell density and breakdown, and in particular MOSFETs having a gate electrode located in a trench, more specifically a low-voltage trench-gated power MOSFET having an improved breakdown characteristic, a thin gate oxide to reduce the gate drive voltage, and a high cell density to lower the on-resistance of the MOSFET.

BACKGROUND OF THE INVENTION

MOSFETs have become the preferred devices for switching currents in numerous fields, including the computer and automotive industries. Three of the principal characteristics of MOSFETs are their gate drive voltage, their on-resistance ($R_{ds}$-on) and their avalanche breakdown voltage ($V_B$). The gate drive voltage is determined primarily by the gate oxide thickness; the thinner the gate oxide, the lower the gate drive voltage. However, a thinner gate oxide leads to a lower breakdown voltage, especially for trench power MOSFETs. The breakdown voltage is normally provided largely by a lightly-doped "drift" region that is located between the drain and body regions of the MOSFET. For example, in MOSFET 10 shown in FIG. 1, a lightly-doped N-epitaxial (epi) layer 104 is grown on a heavily-doped N+ substrate 102, which serves as the drain of the device. (Note that FIG. 1 is not drawn to scale; for example, substrate 102 would typically be much thicker than epi layer 104.) A trench is formed in the top surface of epi layer 104, frequently using a reactive ion etch (RIE) process. The walls of the trench are lined with a gate oxide layer 112, and the trench is filled with a conductive material, often doped polycrystalline silicon (polysilicon), which serves as a gate electrode 110. The top portion of the epi layer 104 is implanted with a P-type impurity such as boron to form a P-body region 108, and using appropriate photoresist masks, N and P type dopants are implanted and diffused to form N+ source regions 110 and P+ body contact regions 118 at the surface of epi layer 104. The implantations used to form P-body region 108, N+ source regions 110 and P+ body contact region 118 are frequently performed before the trench is etched.

A borophosilicate layer 116 is deposited and patterned so that it covers and isolates the gate electrode 110, and a metal layer 114 is deposited over the top surface of the device. Metal layer 114, which can be an aluminum or copper alloy, makes an ohmic electrical contact with N+ source regions 110 and P+ body contact regions 118.

Current flows vertically through MOSFET 10 from the N+ drain 102 and through an N-drift region 106 and a channel region (denoted by the dashed lines) in P-body region 108 to the N+ source regions 110.

The trench is typically made in the form of a lattice that creates a number of MOSFET cells. In a "closed cell" arrangement, the MOSFET cells may be hexagonal, square or circular. In an "open cell" arrangement, the cells are in the form of parallel longintudinal stripes.

When MOSFET 10 is reverse-biased, the N+ drain region 102 is biased positively with respect to the N+ source regions 110. In this situation, the reverse bias voltage appears mainly across the PN junction 120 that separates N-drift region 106 and P-body region 108. N-drift region 106 becomes more and more depleted as the reverse bias voltage increases. When the depletion spreading reaches the boundary between N+ substrate 102 and N-drift region 106, any further increases in the reverse bias are seen at PN junction 120. Thus making N-drift region 106 thicker generally provides greater protection against breakdown. Furthermore, there is a generally inverse relationship between the avalanche breakdown voltage of PN junction 120 and the doping concentration of N-drift region 106, i.e, the lower the doping concentration of N-drift region 106, the higher the breakdown voltage $V_B$ of PN junction 120. See Sze, *Physics of Semiconductor Devices*, $2^{nd}$ Ed., page 101, FIG. 26, which provides a graph showing the relationship between the doping concentration and $V_B$ for several semiconductor materials.

Thus, to increase the breakdown voltage of junction 120, one would like to reduce the doping concentration of N-drift region 106. This in turn, however, reduces the quantity of charge in N-drift region 106 and accelerates the effect of depletion spreading. One solution would be to increase the thickness of N-drift region 106, but this tends to increase the on-resistance of MOSFET 10.

U.S. Pat. No. 5,216,275 describes a high voltage drift structure useful for trench power MOSFETs, diodes, and bipolar transistors. The drift structure includes a "composite buffer layer" that contains alternately arranged areas of opposite conductivity.

In low voltage and high density trench MOSFETs there is another limitation. A high field at the bottom of the gate oxide, which limits the breakdown voltage and the oxide thickness. U.S. Pat. No. 5,168,331 proposes a floating, a lightly doped P-region just below the trench gate oxide to reduce the field which it does. However, P-shield region (e.g., boron atoms) out diffuse towards the P-body, which increases Rds on and /or requires the packing density to be reduced.

The present invention overcomes these problems.

SUMMARY OF THE INVENTION

A trench-gated semiconductor device according to this invention includes a semiconductor substrate of a first conductivity type. An epitaxial layer is formed on the substrate. First and second trenches are formed in the epitaxial layer, the first and second trenches being separated by a mesa. Each of the trenches comprises a gate dielectric layer, the gate dielectric layer lining the walls and floor of the trench, and a gate electrode bounded by the gate dielectric layer. A body region of a second conductivity type is located in the mesa. A source region of the first conductivity type is located adjacent a wall of the trench and the top surface of the epitaxial layer. A drift region of the epitaxial layer is located below the body region and doped with material of the first conductivity type. A field shield region of the second conductivity type is located below each of the trenches, the sides of the field shield region being bounded by dielectric sidewall spacers. The dielectric sidewall spacers separate the field shield region from the drift region of the epitaxial layer. A metal layer lies on top of the epitaxial layer and is in electrical contact with the source region and the body region. The field shield region is electrically connected to the source region and the body region.

With this structure, depletion regions form on both sides of dielectric sidewall spacers when the MOSFET is in an off condition and blocking a voltage. This increases the avalanche breakdown voltage of the device and allows the drift region to be doped ore heavily, reducing the on-resistance of the MOSFET. The dielectric spacers bordering the field shield region confine the field shield region to the area directly beneath the trench floor. Use of the field shield region decouples the gate oxide thickness from the breakdown voltage of the device.

As a result, the cell packing density can be increased, and the gate oxide thickness can be reduced to achieve a threshold voltage as low as 1V Vgs while maintaining a high breakdown voltage.

This invention also includes a process for fabricating a trench-gated semiconductor device. The process includes providing a semiconductor substrate of a first conductivity type; forming an epitaxial layer of the first conductivity type on the substrate; forming first and second trenches in the epitaxial layer, the first and second trenches being separated by a mesa; forming dielectric sidewall spacers on the walls of the trenches; forming a "field shield region" on the bottom of the trench by partially filling the trench with a semiconductor material of a second conductivity type; removing portions of the dielectric sidewall spacers above the field shield region; forming a dielectric layer on the walls of the trenches above the field shield region and on the top surface of the field shield region; and filling an upper portion of the trenches with a conductive gate material.

In one variation of the process, source regions are formed in the mesa by forming a first dielectric layer above the conductive gate material, depositing a layer of polysilicon containing a dopant of the first conductivity type on the entire top surface of the structure and directionally etching the layer of polysilicon to leave a polysilicon spacer adjacent a vertical surface of the first dielectric layer.

DESCRIPTION OF THE INVENTION

Figure 1:
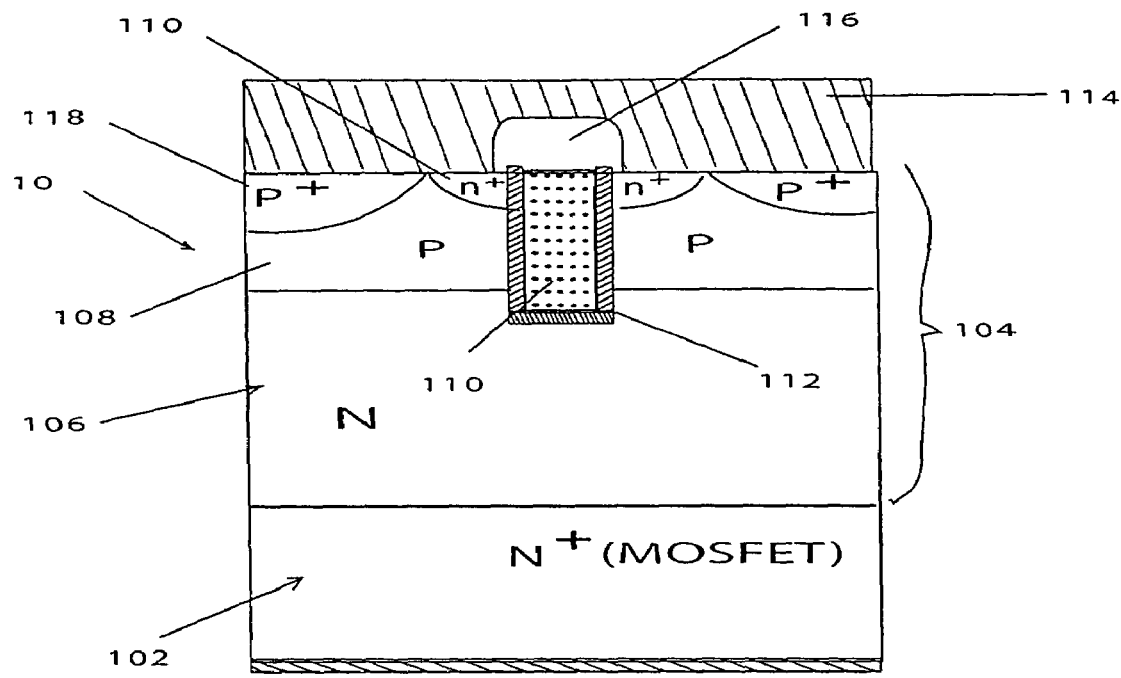
FIG. 1 is a cross-sectional view of a conventional trench-gated MOSFET.
Figure 2A:
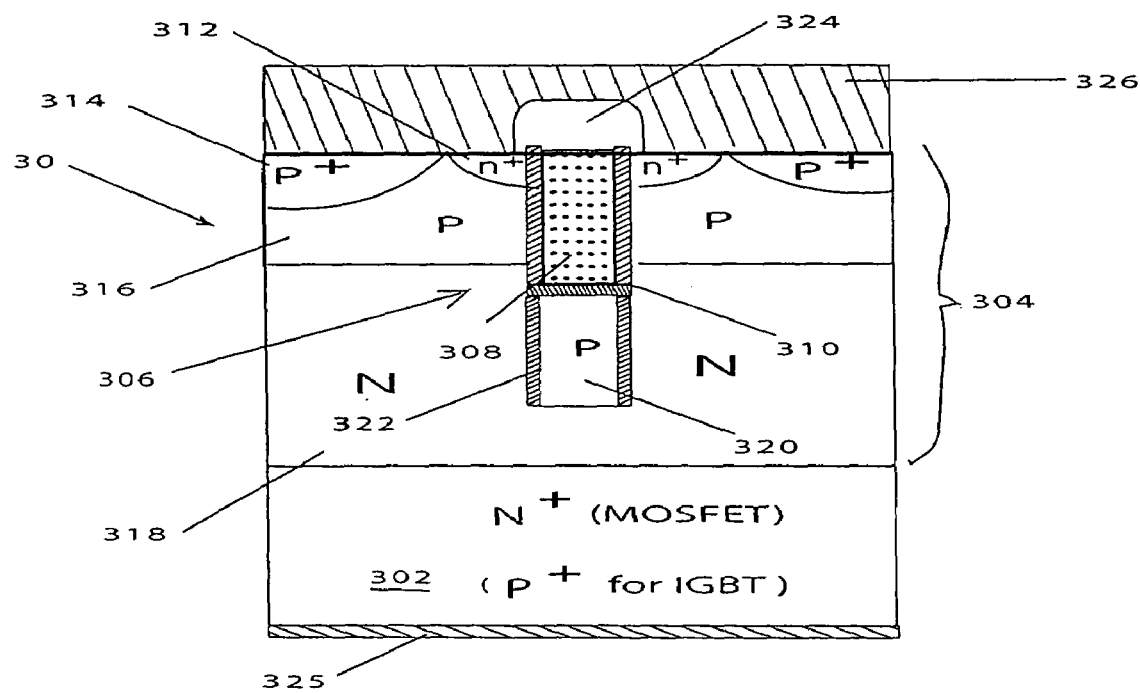
FIG. 2A is a cross-sectional view of a MOSFET/IGBT which includes a field shield region in accordance with this invention.

FIG. 2A shows a MOSFET 30 in accordance with this invention. MOSFET 30 is formed on an N+ substrate 302 and an overlying epi layer 304. Trenches 306 are formed in epi layer 304, and trenches 306 are lined with a gate oxide ($SiO_2$) layer 310 and filled with a gate 308. Alternatively, layer 310 could be formed of silicon nitride ($Si_3N_4$). Gate 308 is typically formed of heavily-doped polysilicon and can include a silicide.

A mesa between trenches 306 includes a P-body region 316. Within P-body region 316 are N+ source regions 312 and a P+ body contact region 314. The top surface of gate 308 is covered with a BPSG layer 324. A source metal layer 326 overlies BPSG layer 324 and makes electrical contact with N+ source regions 312 and P+ body contact regions 314. Similarly, a metal layer 325 contacts N+ substrate 302, which functions as the drain. The electrical contact between metal layer 325 and N+ substrate 302 could be ohmic or could include a Schottky barrier.

The remaining portion of epi layer 304 is divided into N drift region 318 and P field shield regions 320. Each of P field shield regions 320 is located below one of trenches 306 and is separated laterally from N drift region 318 by oxide sidewall spacers 322. In some embodiments, field shield regions 320 could extend downward to N+ substrate 302.

FIG. 2A illustrates the present innovation in a "U" shaped trench gate device. However the basic "field shield region" bounded by dielectric sidewalls only or by dielectric sidewalls and a dielectric top wall is applicable to devices of many shapes, including devices having gates in U-shaped or V-shaped grooves and planar structures.

Figure 2B:
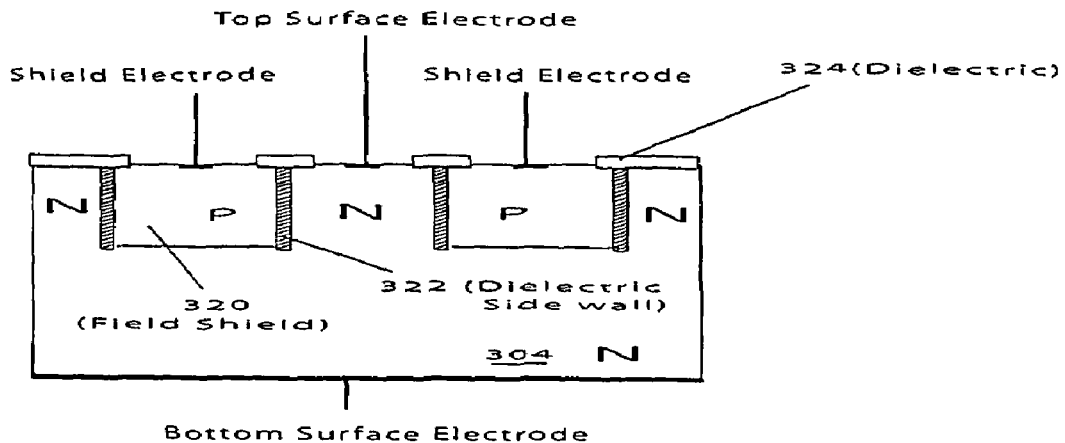
FIG. 2B is a cross-sectional view of a semiconductor device containing a generalized field shield region in accordance with this invention.
Figure 2C:
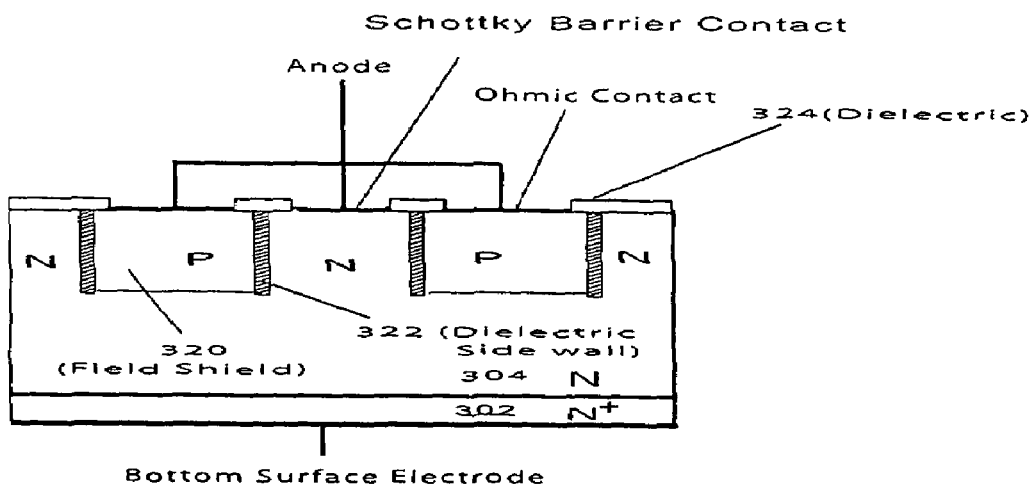
FIG. 2C is a cross-sectional view of a Schottky barrier diode containing a field shield region in accordance with this invention.

A key innovation in FIG. 2A is the structure below the trench gate; the P-field shield region 320 is laterally bounded by dielectric sidewalls 322 and bounded on the bottom by the PN junction with by N-region 318. This more general structure is illustrated in FIG. 2B. P-field shield region 320 may be electrically biased either by shorting P-field shield region 320 to the top surface electrode of the N– region, as shown in FIG. 2C, or P-field shield region 320 may be biased independently with a separate voltage source, as shown in FIG. 2B . The contact with the top surface of the N-region can be either a Schottky barrier or an ohmic contact.

Figure 2D:
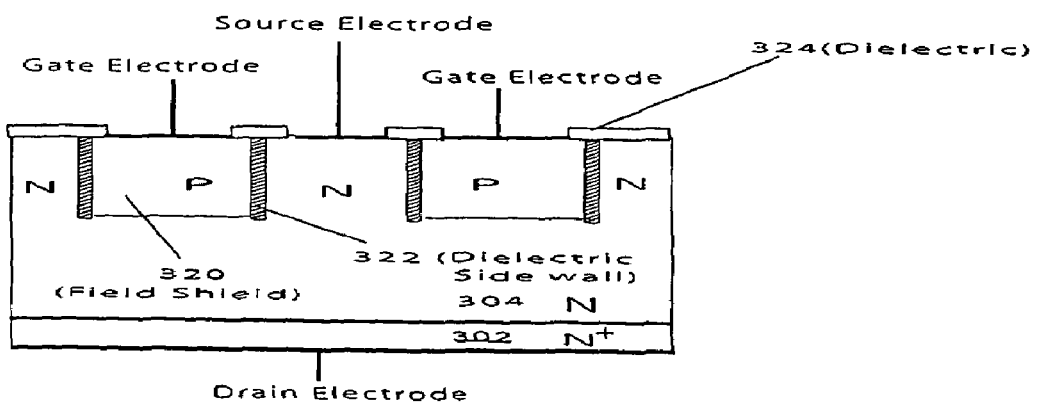
FIG. 2D is a cross-sectional view of a vertical JFET device containing a field shield region in accordance with this invention.

P-shield regions 320 can be formed by a selective epitaxial deposition after the RIE etch of the silicon and after the formation of a sidewall oxide. The basic structure shown in FIG. 2B is applied to a trench MOSFET (N+ substrate) and also IGBT (P+ substrate) structure in FIG. 2A to improve the blocking capability with thin gate oxide. The structure shown in FIG. 2B can be applied to make a low barrier height diode such as the Schottky barrier diode, as shown in FIG. 2C, or the vertical JFET structure, as shown in FIG. 2D. The devices shown in FIGS. 2A-2D share the novel field shield structure, which is a P-region bounded by dielectric walls on the sides and a PN junction below. The dielectric sidewalls prevent the spread of the P region laterally by blocking the lateral diffusion of acceptors (e.g., boron) during device processing at high temperatures (e.g., above 800° C.). Of course, the polarities may be reversed in which case the field shield region would be formed of N-type material.

Figure 3A:
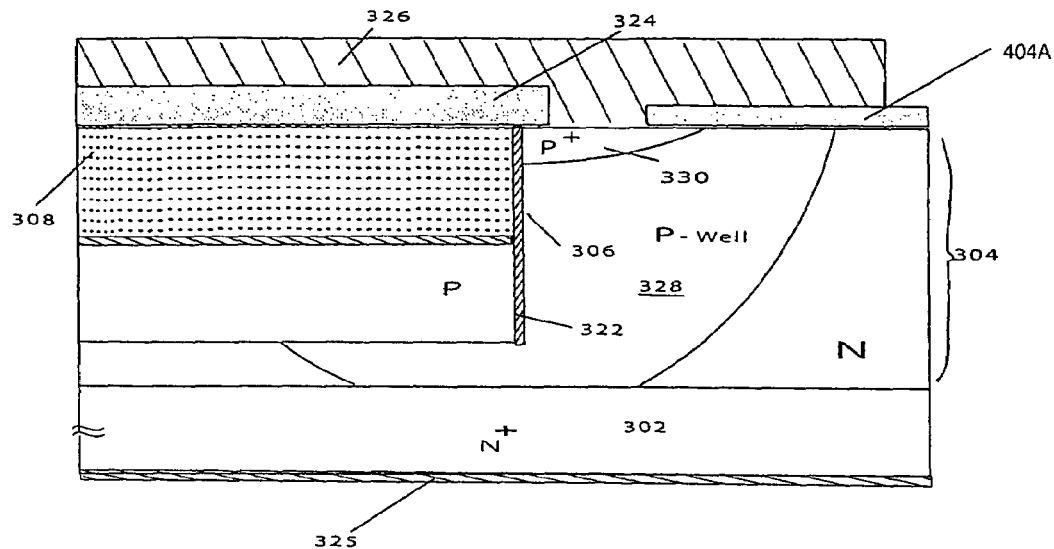
FIGS. 3A and 3B illustrate techniques for establishing electrical contact between the field shield regions and the source regions in the MOSFET shown in FIG. 2.
Figure 3B:
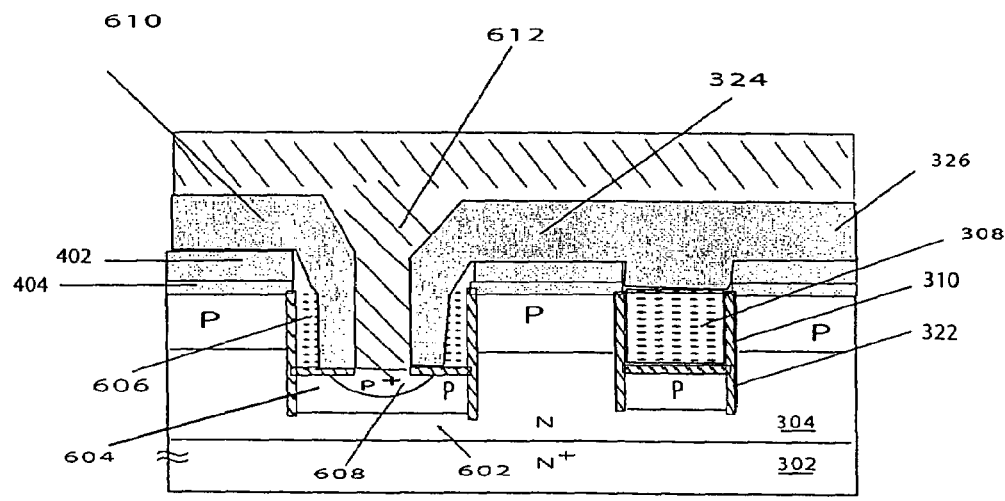

Each of field shield regions 320 is connected to P-body regions 316 and N+ source regions 312 in the third dimension, outside the plane of the drawing. FIGS. 3A and 3B illustrate how this can be done. FIG. 3A is a cross-sectional view taken at the end of one of trenches 306 showing how field shield regions 320 can be connected to P-body regions 316 and N+ source regions 312. A P-well 328 is formed by ion implantation through a mask and diffusing a P-type dopant such as boron at the ends of trenches 306. As the P-type dopant diffuses, the P-well expands laterally under the sidewall spacers 322 and merges with the field shield regions 320. A P+ contact region 330 is formed beneath an opening in BPSG layer 324 at the surface of epi layer 304 to form an ohmic contact with metal layer 326. P+ contact region 330 can be formed during the same process step as P+ body contact region 314, shown in FIG. 2A. Since metal layer 326 is in electrical contact with N+ source regions 312 and P-body contact regions 314 (see FIG. 2A), field shield regions 320 are likewise in electrical contact with N+ source regions 312 and P+ body contact regions 314.

Field shield regions 320 can also be connected to N+ source regions 312 and P+ body contact regions 314 by means of a wide trench, as shown in FIG. 3B. Wide trench 602 is an extension of trench 306 and may be located at the end of each rectangular trench cell, for example. At the bottom of trench 602 is a P shield region 604, which is an extension of field shield region 320. Also included in trench 602 are polysilicon spacers 606, BPSG spacers 610, and a metal plug 612. Metal plug 612 extends downward from metal layer 326. A P+ region 608 within P shield region 604 provides an ohmic contact with metal slug 612. Therefore, since P shield region 604 is an extension of field shield region 320, and since metal layer 326 gags is in electrical contact with N+ source regions 312 and P+ body contact regions 314, this structure forms an electrical link between field shield region 320 and both N+ source regions 312 and P+ body contact regions 314.

Referring again to FIG. 2A, with this structure depletion regions form on both sides of dielectric sidewalls or sidewall spacers 322 when MOSFET 30 is turned off, with N+ substrate 302 biased positive with respect to source regions N+. This increases the avalanche breakdown voltage of the device and allows N drift region 318 to be doped more heavily, reducing the $R_{ds}$- on of MOSFET 30.

FIGS. 4A-4H illustrate a process sequence that can be used to fabricate MOSFET 30. The process begins with the formation of epi layer 304 on top of N+ substrate 302. Because of the additional voltage blocking capability described above, epi layer 304 can be doped with an N-type dopant such as phosphorus to a concentration of $4 \times 10^{16}$ $cm^{-3}$ to $8 \times 10^{16}$ $cm^{-3}$, for example, as compared with the normal doping concentration of $1 \times 10^{16}$ $cm^{-3}$ to $2.5 \times 10^{16}$ $cm^{-3}$ for a trench MOSFET with 30V breakdown. Prior to the process step illustrated in FIG. 4A, the structure is masked, and boron is implanted at a dose in the range of $1 \times 10^{13}$ $cm^{-2}$ to $5 \times 10^{13}$ $cm^{-2}$ to form P-wells, such as the P well 328 shown in FIG. 3A, that are used to contact the field shield regions.

Figure 4A:
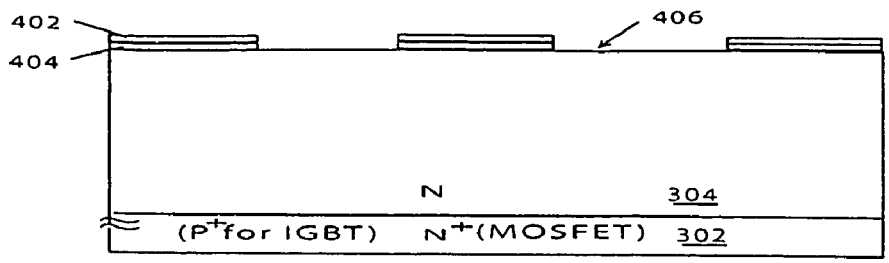
FIGS. 4A-4H illustrate a process sequence for fabricating the MOSFET/IGBT shown in FIG. 2A FIGS. 5A-5G illustrate a process sequence for fabricating an alternative embodiment of the invention.

A second photoresist mask is then formed over what is to be the active area of the device, and a thick field oxide layer (e.g., 0.2-1.0 μm thick) is thermally grown in what are to be the voltage termination regions (die edges) of the MOSFET. Then, as shown in FIG. 4A, a pad oxide layer 404 is thermally grown on the surface of epi layer 304 and a silicon nitride layer 402 is deposited over pad oxide layer 404. A third photoresist mask (trench mask) is formed atop nitride layer 402, and nitride layer 402 and oxide layer 404 are etched through openings in the trench mask to form openings 406.

Figure 4B:
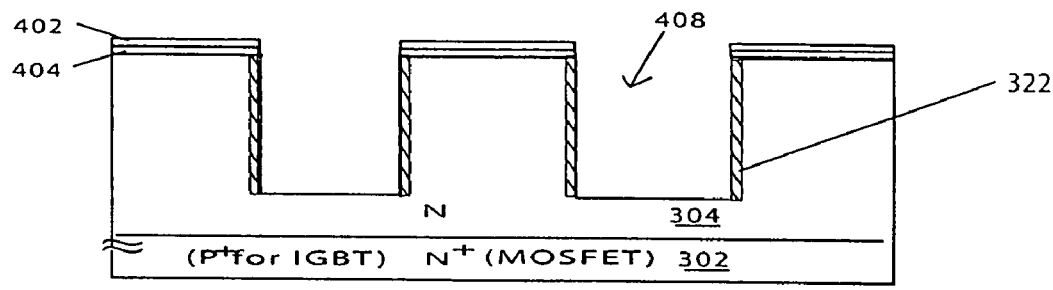

As shown in FIG. 4B, trenches 408 are etched through openings 406. Trenches 408 can be relatively deep (e.g., 3 μm deep). An oxide layer which will form sidewall spacers 322, which can be 0.05 to 0.1 μm thick, is grown thermally on the walls and bottoms of trenches 408, and a directional reactive ion etch (RIE) process is used to remove the oxide layer from the bottoms of trenches 408, leaving sidewall spacers 322. Oxide layer 404 and nitride layer 402 are removed.

Figure 4C:
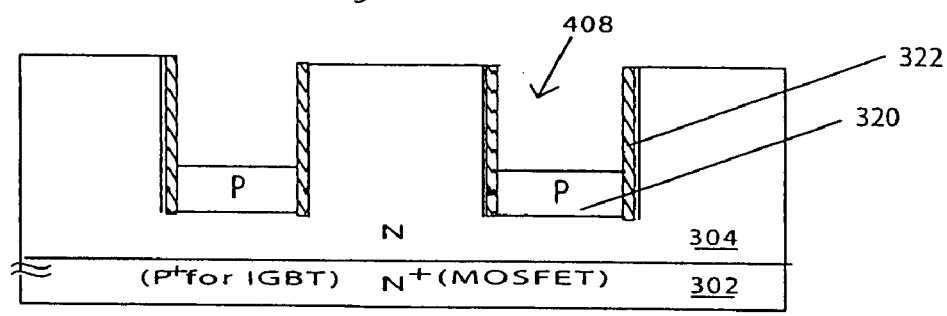

As shown in FIG. 4C, a P-type epitaxial layer is selectively deposited in the trenches 408 and then etched back to a thickness of 1.0-1.5 μm, for example. This forms field shield regions 320.

Figure 4D:
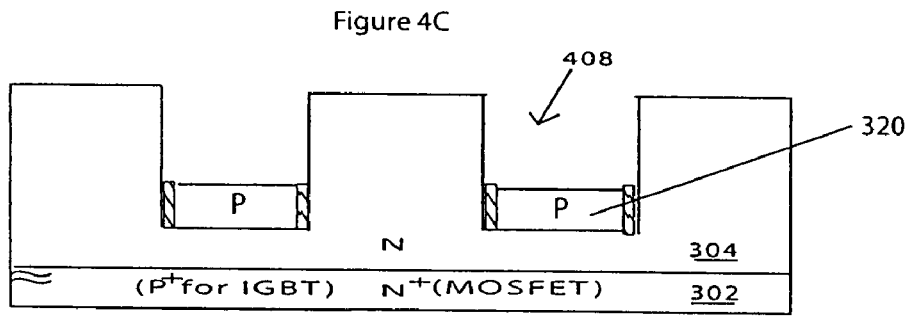

Referring to FIG. 4D, the exposed portions of sidewall spacers 322 are removed by isotropic oxide etch, typically diluted HF(hydrofluoric acid), leaving the field shield regions 320 and the portions of sidewall spacers 322 that are embedded between field shield regions 320 and N epi layer 304.

Figure 4E:
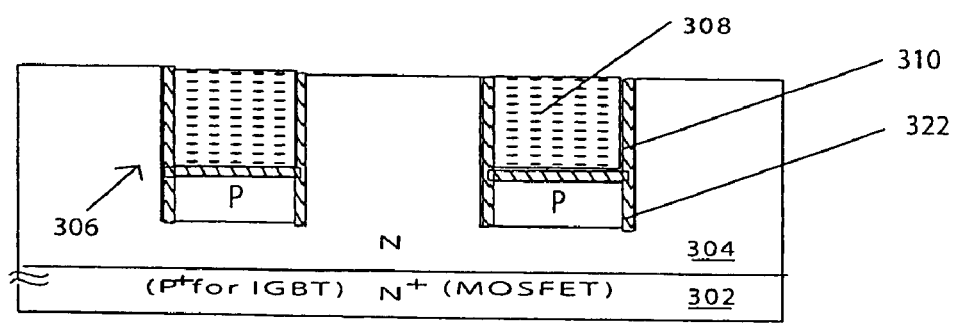

As shown in FIG. 4E, gate oxide layer 310 is thermally grown on the exposed portions of the walls of trenches 408 and top surfaces of field shield regions 320, and the upper portion of trenches 408 are then filled with polysilicon gate 308, which is preferably heavily doped with an N-type dopant by ion implantation, POC13 or in situ. The polysilicon typically covers the top surface of epi layer 304 and is etched back by using a fourth, polysilicon mask so that it is coplanar with the top surface of epi layer 304 (although typically the polysilicon is etched back slightly into the trenches).

Figure 4F:
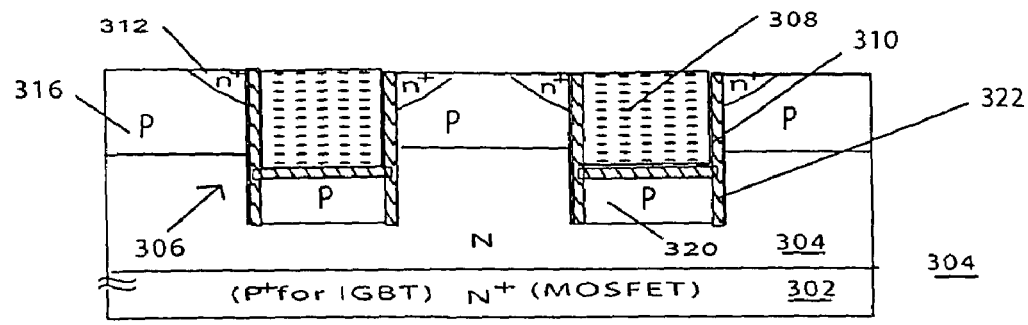

As shown in FIG. 4F, a P-type dopant is implanted and diffused to form P-body regions 316. This can be done without a mask. A fifth photoresist mask (source mask) is then formed on the top surface of the structure, and the source mask is patterned photolithographically to create openings where the N+ source regions 312 are to be located. Next, an N-type dopant is implanted to form N+ source regions 312. The mask is then removed.

Figure 4G:
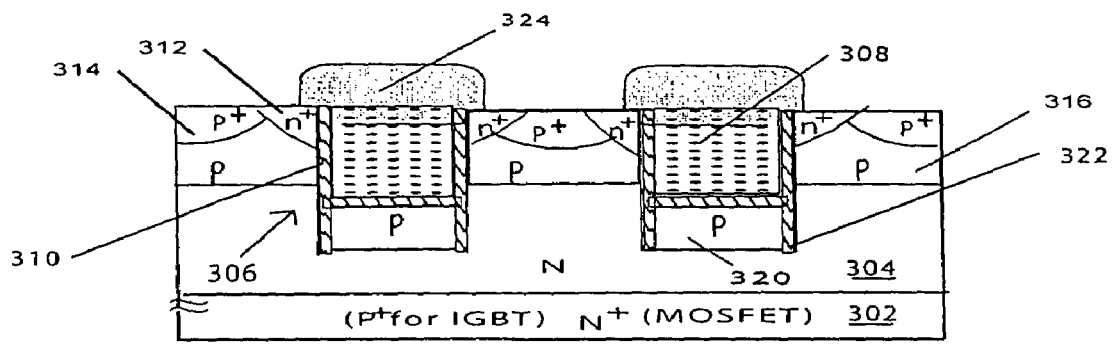

BPSG layer 324 is deposited. A sixth photoresist mask (contact mask) is formed on BPSG layer 324, with openings over the mesas, and BPSG layer 324 is etched, as shown in FIG. 4G. Using the contact mask, a second P-type dopant is implanted to form P+ body contact regions 314. A thermal diffusion typically follows each of these implants to activate the dopant.

Figure 4H:
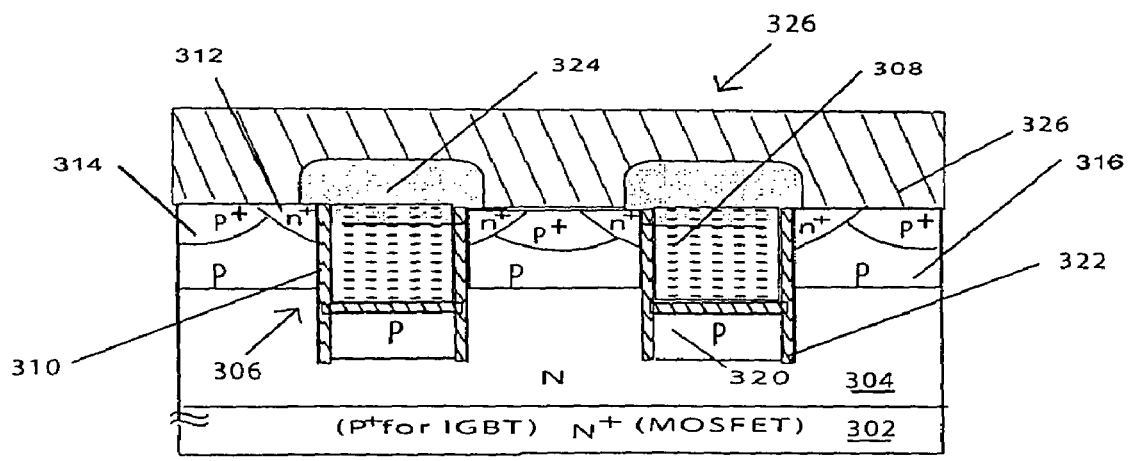

As shown in FIG. 4H, metal layer 326 is deposited over the top surface of the structure to make an ohmic contact with N+ source regions 312 and P+ body contact regions 314. Metal layer 326 can be formed of Al:Si and can be from 1.3 to 5.0 μm thick. Typically a thin Ti/TiN barrier layer (not shown) is deposited under metal layer 326. The result is MOSFET 30, shown in FIG. 2A. A seventh photoresist mask (metal mask) is formed over metal layer 326, and metal layer 326 is etched through the metal mask to separate the portion of metal layer 326 that contacts N+ source regions 312 from the portion (not shown) that contacts the gate 308.

Figure 5A:
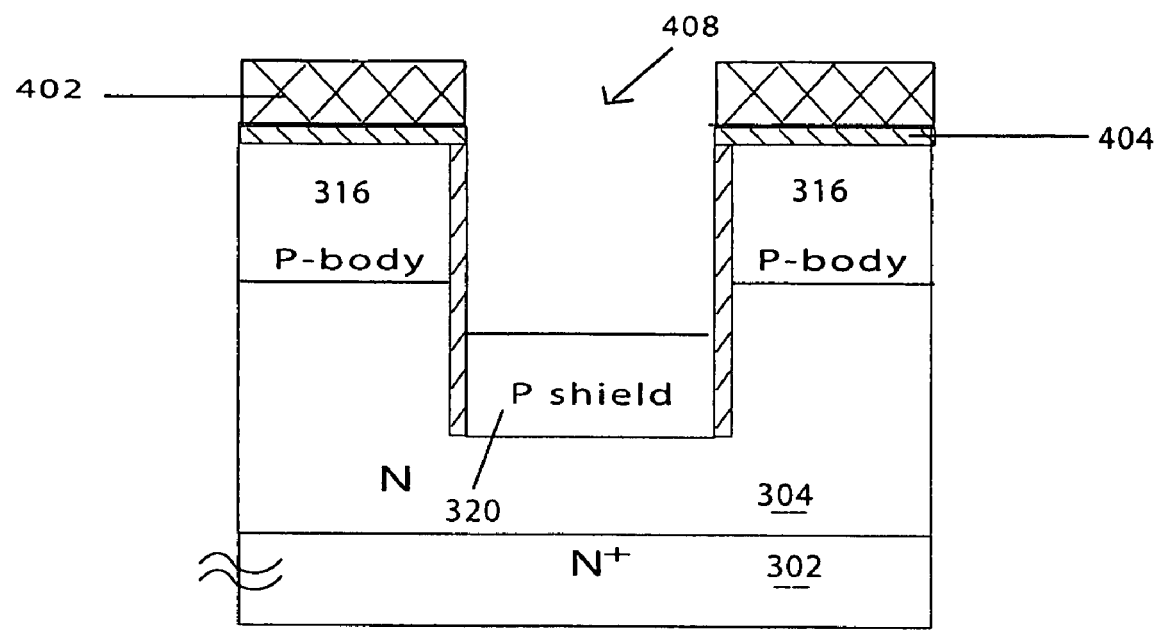

FIGS. 5A-5G illustrate a process that can be used to form an alternative embodiment of the invention. This process can use as few as three masks and as many as seven masks. However, FIGS. 5A-5G illustrate a three-mask version of the process. The process described above in FIGS. 4A-4C is carried out, except that a blanket implant and diffusion to form P body region 316 is performed before pad oxide layer 404 and nitride layer 402 are deposited. As described above, trench mask is used to define the location of the trench. After field shield region 320 has been formed, as shown in FIG. 4C, pad oxide layer 404 and nitride layer 402 are left in place, as shown in FIG. 5A. The doping concentration of field shield region 320 may be in the range of $5 \times 10^{16}$ to $5 \times 10^{17}$ cm$^{-3}$, for example.

Figure 5B:
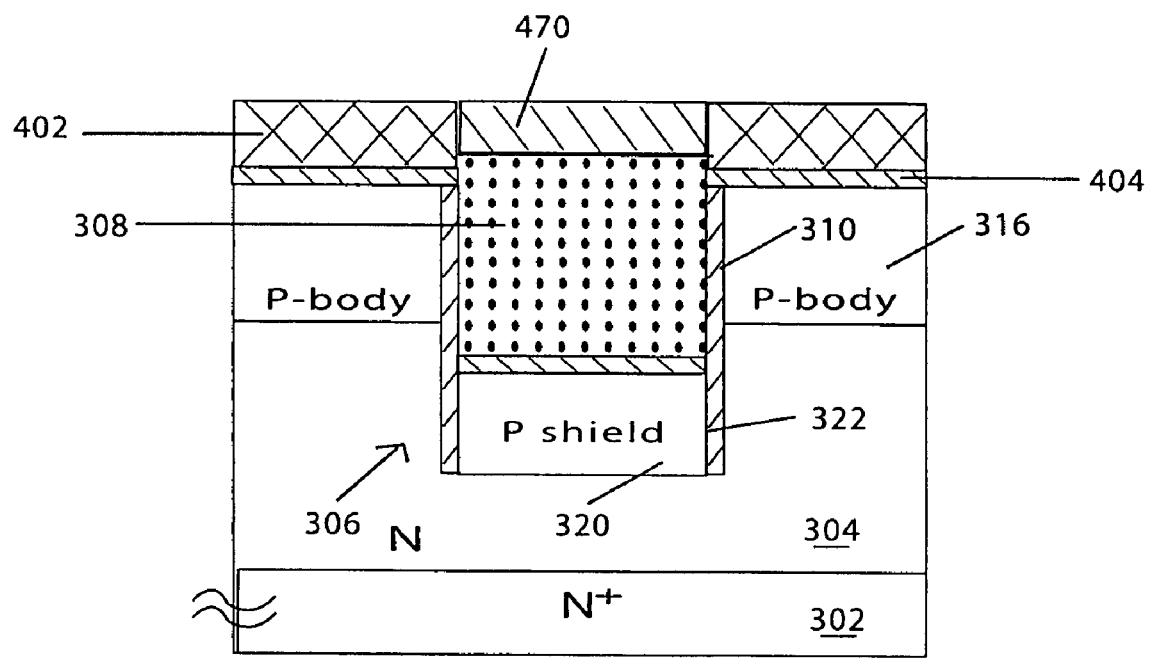

The exposed portions of oxide layers 322 are then removed. Gate oxide layer 310 is thermally grown on the exposed sidewalls of the trench and on the exposed upper surface of field shield region 320. The upper portion of trench 408 is then filled with polysilicon gate 308, which is preferably doped with an N-type dopant by ion implantation, POCl3, or preferably in situ. The polysilicon is etched back so that its top surface adjoins nitride layer 402. As described above a BPSG layer 324 is deposited on the top surface of the structure and etched back, using an RIE process, or planarized, using a chemical-mechanical polishing technique, until the top surface of BPSG layer 324 is coplanar with the top surface of nitride layer 402, thereby forming a BPSG plug 470. The resulting structure is shown in FIG. 5B.

Figure 5C:
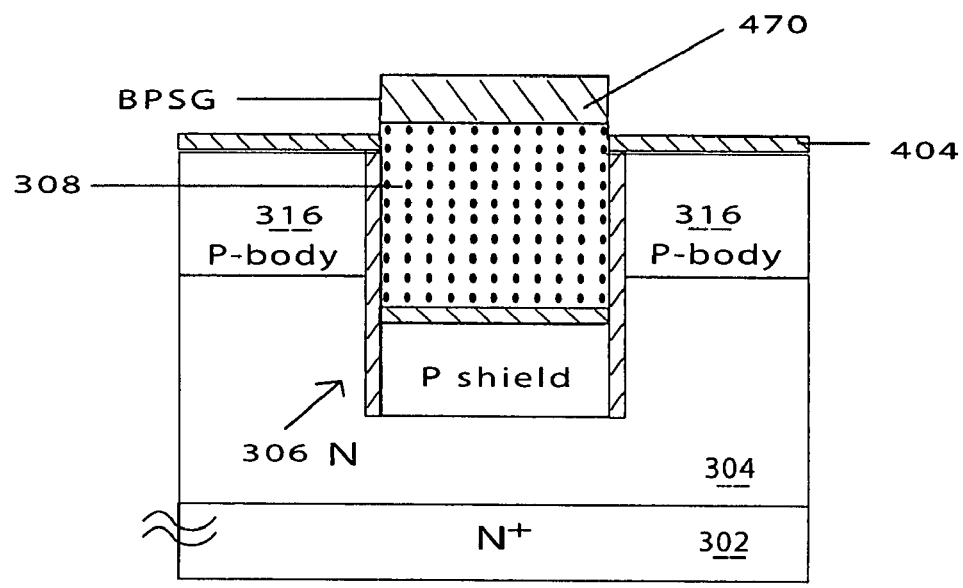

Nitride layer 402 is then removed, preferably without a mask, to yield the structure shown in FIG. 5C.

Figure 5D:
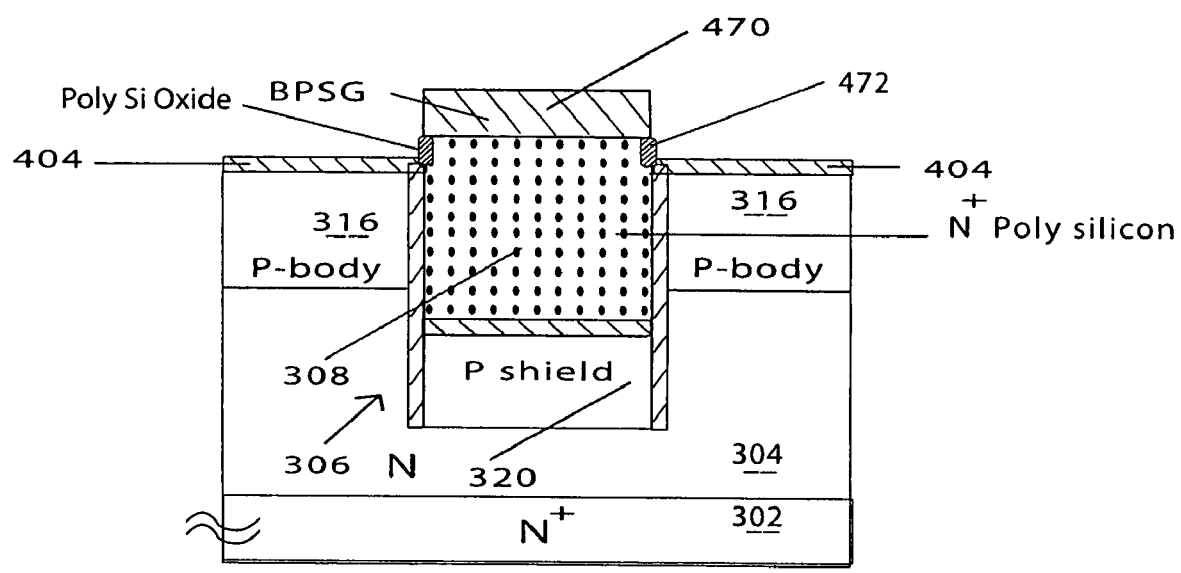

As shown in FIG. 5D, the structure is then heated in a dry-oxidation furnace (e.g., at 900-1000° C. for 10-30 minutes) to oxidize the exposed sidewalls of polysilicon gate 308, forming oxide layers 472.

Figure 5E:
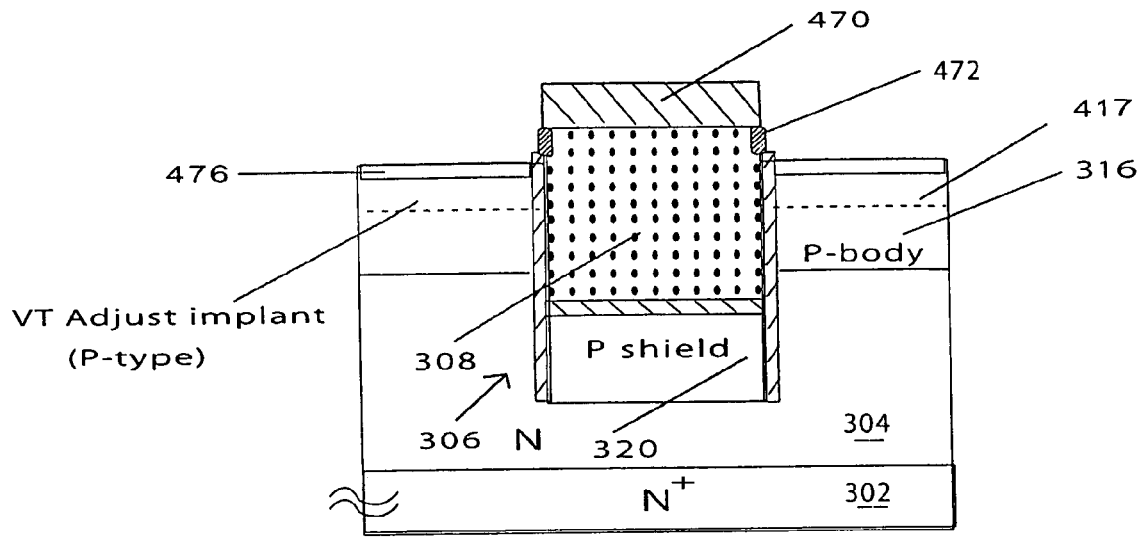

As shown in FIG. 5E, pad oxide layer 404 is removed, and a P-type dopant is implanted and diffused to adjust the threshold voltage of the MOSFET to be formed. The areas in which this dopant is located are labeled 417. An N-type dopant is implanted and diffused to form N+ source layer 476.

Figure 5F:
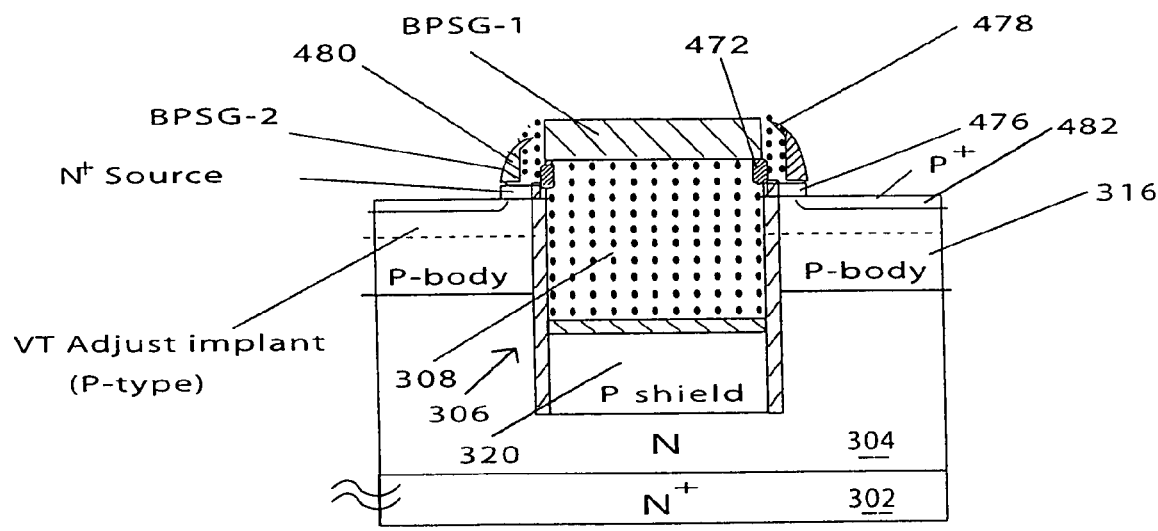

As shown in FIG. 5F, a second, N+ doped polysilicon layer is deposited over the top surface of the structure, and is then removed using a directional RIE process to leave N+ polysilicon spacers 478 adjacent the sidewalls of BPSG layer 470. Polysilicon spacers 478 also abut the exposed surfaces of oxide layers 472. A second BPSG layer is deposited over the top surface of the structure and is then removed using a directional RIE process to leave BPSG spacers 480 adjacent polysilicon spacers 478. As a result, at this point of the process both polysilicon spacers 478 and BPSG spacers 480 are attached to the sides of BPSG layer 470. Alternatively, a silicon nitride layer could be deposited instead of the second BPSG layer in which case spacers 480 would be made of nitride.

Using BPSG layer 470 and spacers 478 and 480 as a mask, the top surface of epi layer 304 is etched using an RIE process to remove the exposed portions of N+ source layer 476. Using the same mask, a P-type dopant is implanted at a relatively low energy to form P+ body contact regions 482. This produces the structure illustrated in FIG. 5F.

BPSG layer 470 and BPSG (or nitride) spacers 480 are etched (e.g., about 500 Å) to expose more of N+ polysilicon spacers 478 and N+ source layer (now region) 476. In this process all of BPSG spacers may be removed.

Figure 5G:
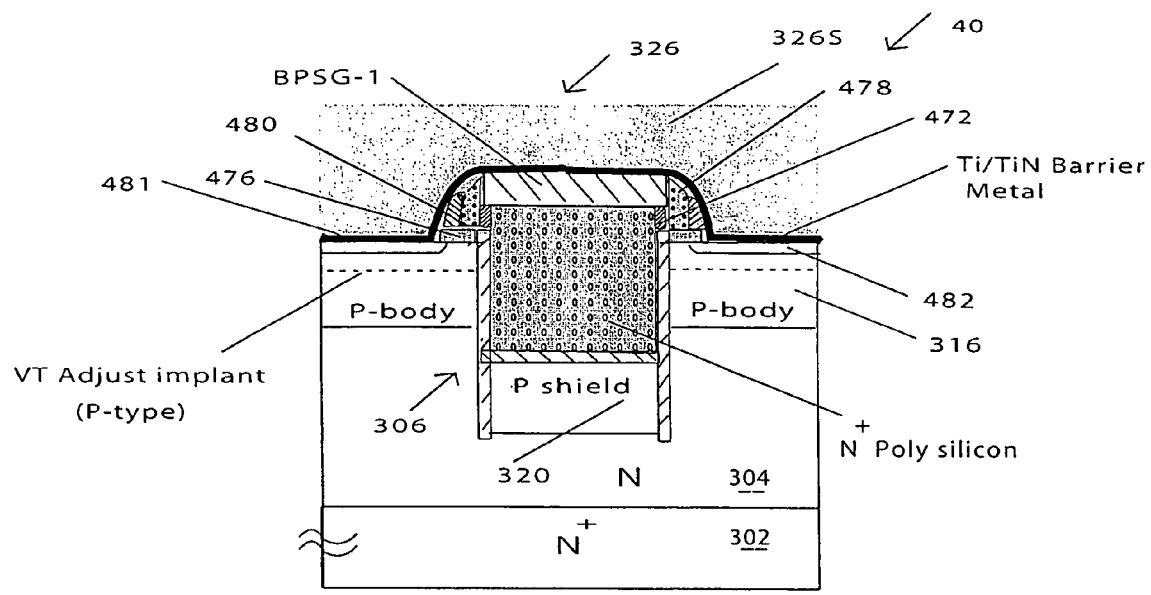

As shown in FIG. 5G, a barrier metal layer 481 formed of Ti/TiN is deposited by sputtering or CVD. Barrier metal layer 481 could be 1000 Å thick. This is followed by the deposition of metal layer 326, which could be from 2 to 8 μm thick. Metal layer 326 could be made of Al and could include up to 1% Si and 0.4% Cu. A photoresist metal mask is then typically formed atop metal layer 326, and metal layer 326 is etched to separate the metal layer 324S that contacts the N+ source regions 476 (shown in FIG. 5G) from the portion (not shown) that contacts the gate 308.

The result of this process is MOSFET 40, shown in FIG. 5G.

Figure 6:
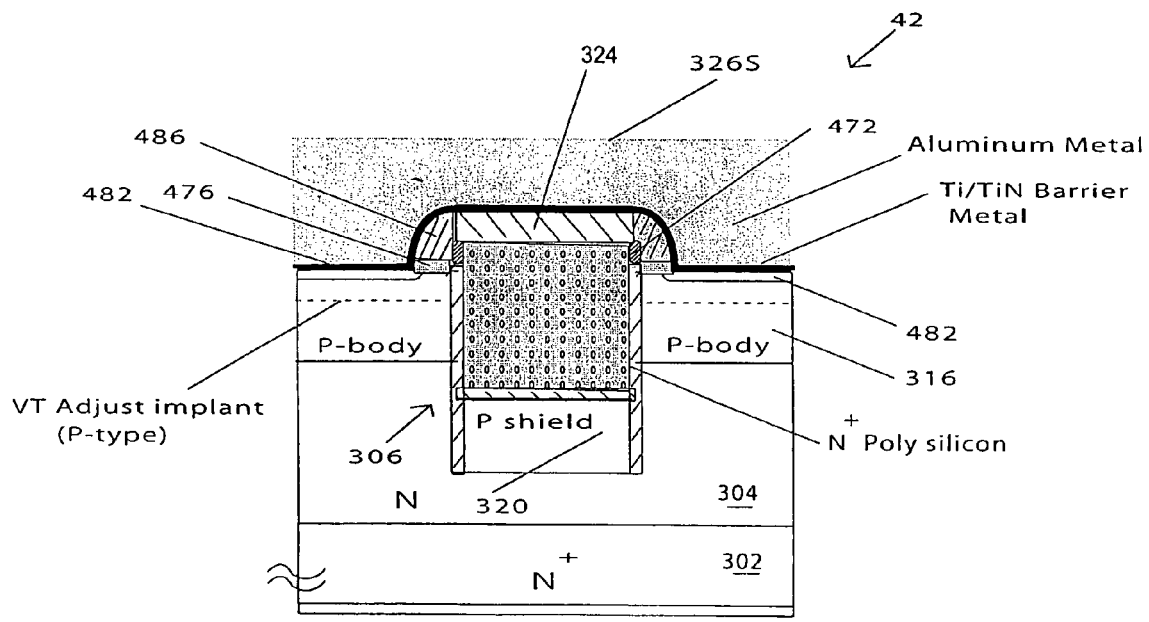
FIG. 6 illustrates a variation of the MOSFET shown in FIG. 5G.

In an alternative embodiment, nitride spacers 486 are substituted for polysilicon spacers 478 and BPSG spacers 480, producing MOSFET 42 shown in FIG. 6

Figure 7:
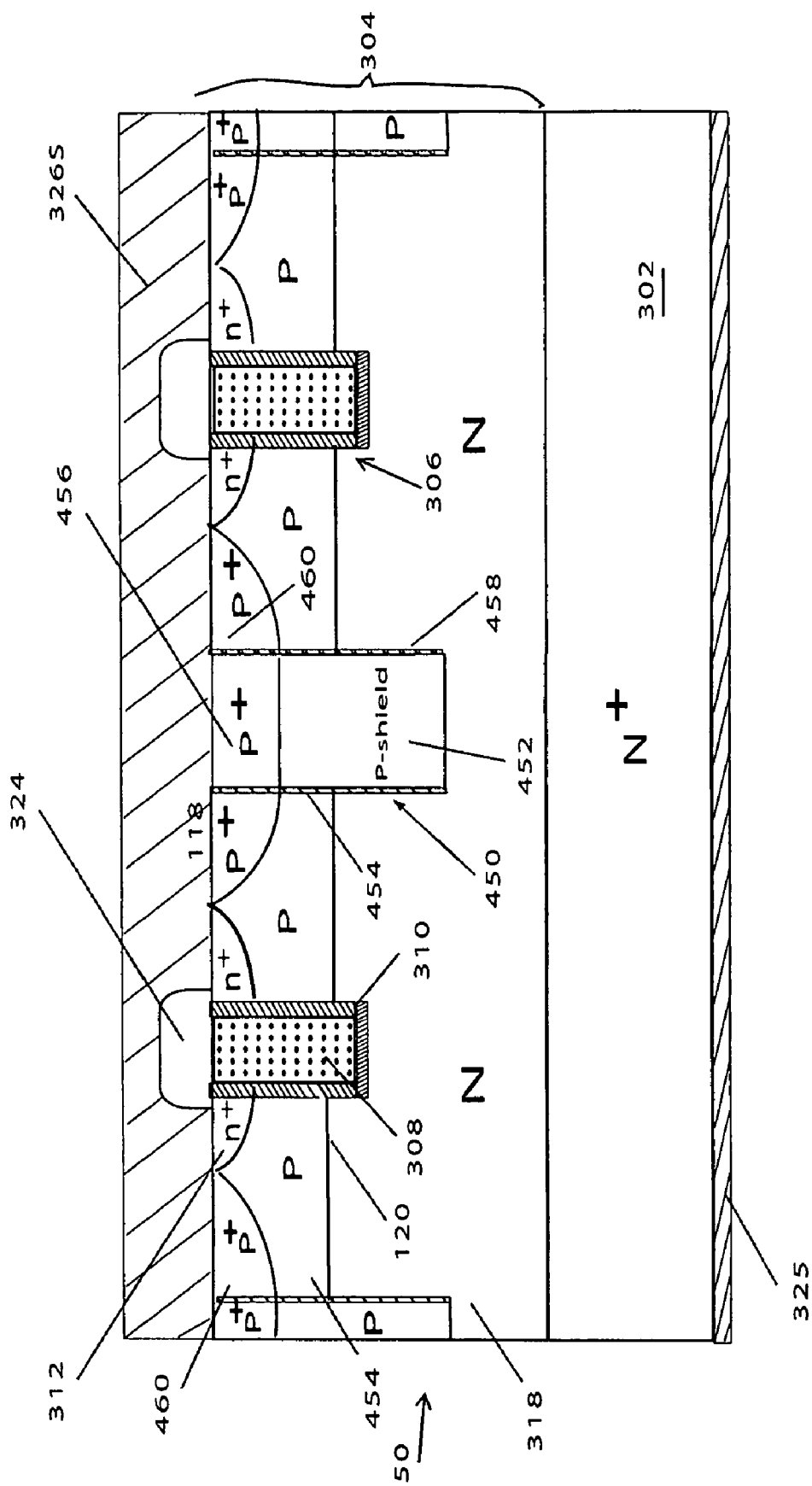
FIG. 7 shows another alternative embodiment of a MOSFET in accordance with this invention.

FIG. 7 shows an alternative embodiment according to the invention. Again, MOSFET 50 is formed in epi layer 304 that is grown on N+ substrate 302. Trenches 306 are formed in epi layer 304, and trenches 306 are lined with gate oxide layer 310 and filled with polysilicon gate 308. Deep trenches 450 are formed in the mesas between trenches 306. The walls of each trench 450 are lined with oxide sidewall spacers 458, and each trench 450 contains a P shield region 452 and a P+ contact region 456. Within the mesa between trenches 306 are a P-body region 454, N+ source regions 312 and P+ body contact regions 460. The top surface of each gate 308 is covered with a BPSG layer 324. Source metal layer 326S overlies BPSG layer 324 and makes electrical contact with N+ source regions 312, P+ body contact regions 460 and P+ contact region 456. Similarly, metal layer 325 contacts N+ substrate 302, which functions as the drain. The remainder of epi layer 304, outside the mesa between trenches 306, includes N drift region 318, which is more lightly doped than N+ substrate 302.

Thus, P+ body contact regions 460, P-body regions 454, N+ source regions 312, P+ contact region 456 and P shield region 452 are all biased to the source potential through metal layer 326S. When MOSFET is blocking voltage in an off condition, depletion regions spread outward from sidewall spacers 458 into N drift region 318. Thus, a vertical junction field-effect transistor (JFET) forms between adjacent deep trenches 450, underneath trenches 306. The N drift region 318 is largely depleted by the adjacent deep trenches 450 when MOSFET is blocking a voltage. This increases the breakdown potential of MOSFET 50 and protects the corners of trenches 306 and gate oxide layers in trenches 306 from the high electric field that would otherwise result from a high source-to-drain voltage and high gate-to-drain voltage. N drift region 318 can be doped to a higher concentration than would otherwise be possible, reducing the on-resistance of MOSFET 50.

MOSFET 50 can be fabricated with a conventional process, except that an additional mask and etch for the deep trenches 450 is required. An oxide layer is grown on the sidewalls and floor of the deep trenches 450, and the oxide layer is removed from the floor of the deep trenches 450 by an RIE process to leave oxide spacers 458. A selective epi growth process is used to form P shield regions 452. After the formation of the P shield regions 452, a normal trench MOSFET process can be used to fabricate trenches 306 and the remainder of MOSFET 50.

Figure 8A:
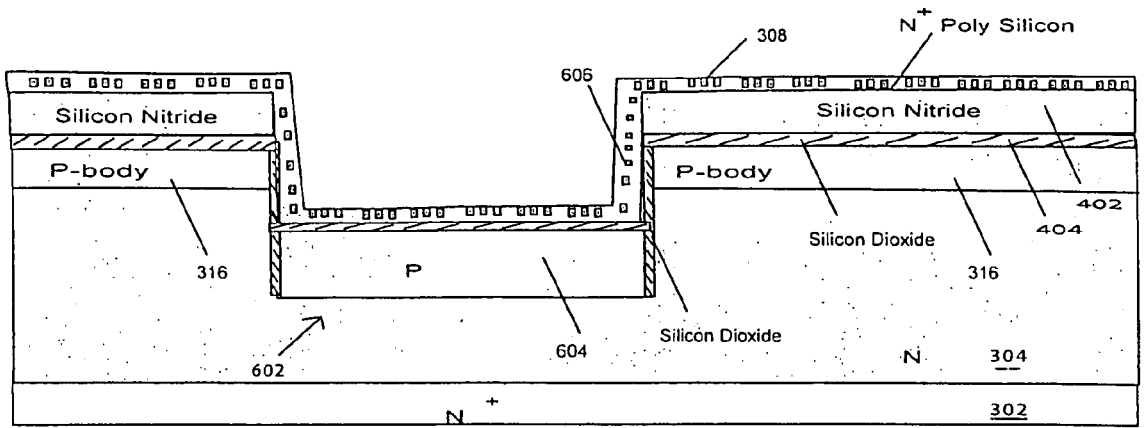
FIGS. 8A-8C illustrate a process for forming the field shield contact shown in FIG. 3B when the process shown in FIGS. 4A-4H is used to manufacture the MOSFET.
Figure 8B:
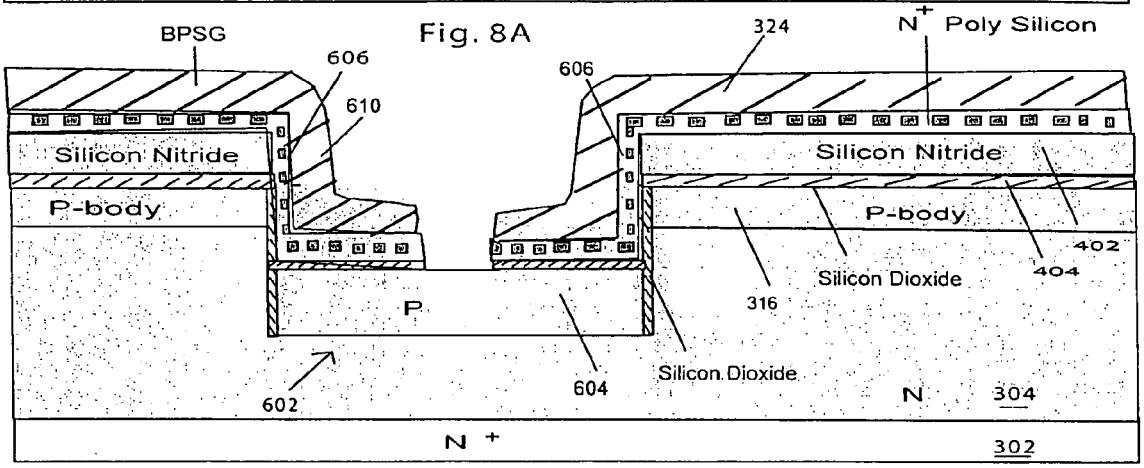
Figure 8C:
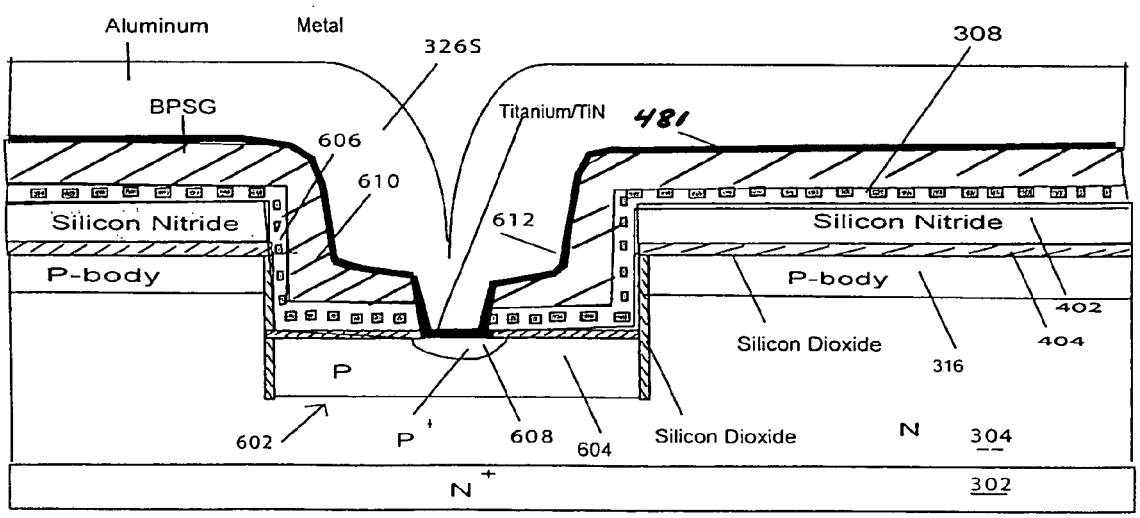
Figure 9:
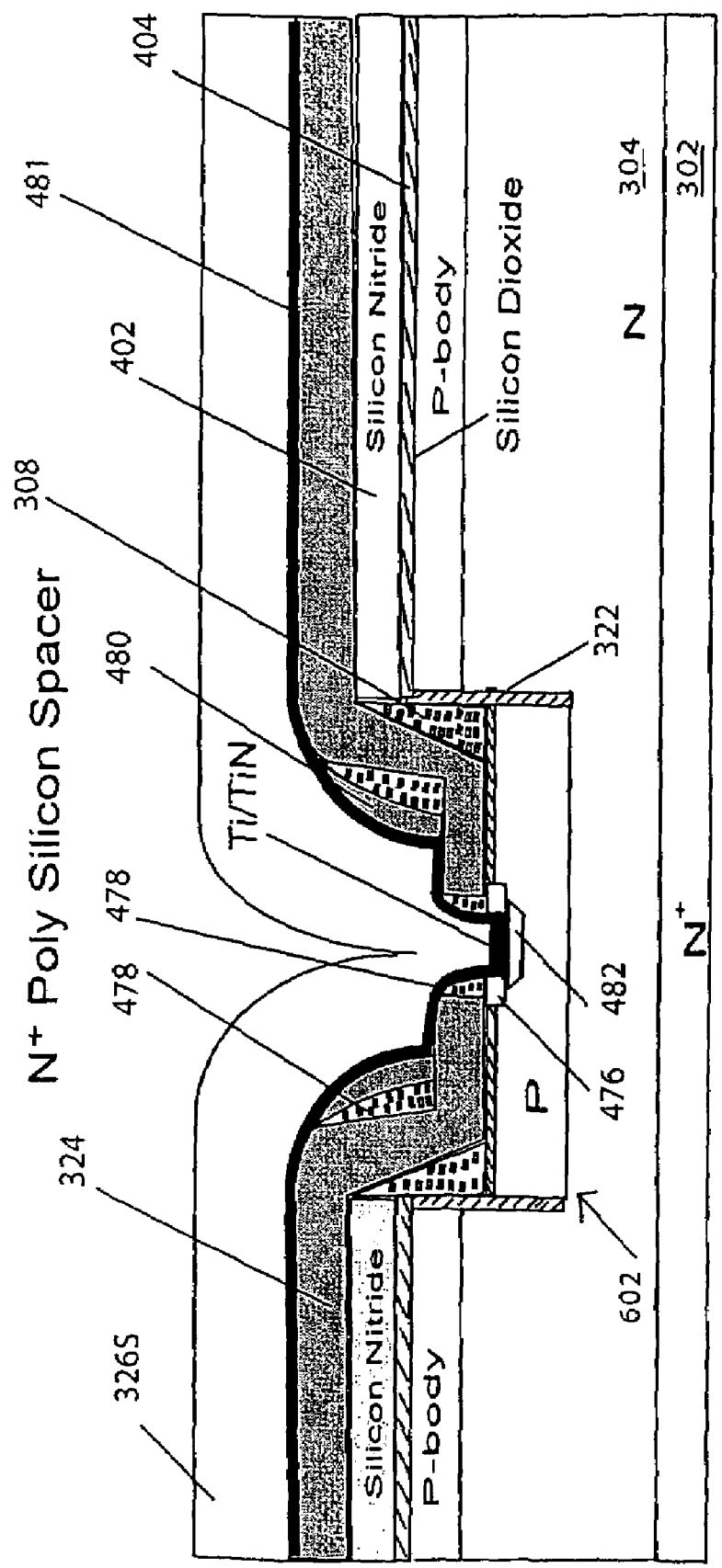
FIG. 9 illustrates an alternative process for forming the field shield contact shown in FIG. 3B when the process shown in FIGS. 5A-5G is used to manufacture the MOSFET.

Referring again to FIG. 3B, a manufacturing process for making electrical contact with the field shield regions by means of a wide trench is illustrated in FIGS. 8A-8C. This is part of the process flow illustrated in FIGS. 4A-4H. Pad oxide layer 402 and nitride layer 404 are patterned (FIG. 4A) so as to form wide trenches 602 in the locations on the chip where the field shield region is to be contacted. The process steps described in FIGS. 4B-4D are then undertaken to form P shield region 604. When N+ polysilicon layer 308 is deposited (FIG. 4E), it conforms to the contours of wide trench 602, as shown in FIG. 8A. When BPSG layer 324 is deposited (FIG. 4G), it likewise conforms to the contours of wide trench 602, as shown in FIG. 8B. Referring further to FIG. 8B, when BPSG layer 324 is masked, an opening is formed in the central region of wide trench 602, and BPSG layer 324, polysilicon layer 308 and the thin oxide layer over P shield region 604 are etched through this opening to form the structure shown in FIG. 8B. This produces polysilicon spacers 606 and BPSG spacers 610 on the walls of wide trench 602. P shield region 604 contains a P+ region 608, which can be formed at the same time as P+ body contact region 314. When metal layer 326 is deposited (FIG. 4H), it flows into wide trench 602 and forms an electrical contact with P shield region 604, as shown in FIG. 8C The use of this process in the basic process sequence shown in FIGS. 5A-5G produces a similar result, except that, as shown in FIG.9, there is no polysilicon layer 308 on the die surface, only inside the trenches. Therefore, in the three-mask process, N+ polysilicon and BPSG sidewall spacers are formed on the vertical surfaces of BPSG layer 324. As mentioned above, a portion of metal layer 326S (not shown) is used to contact the polysilicon gate 308.

Figure 10:
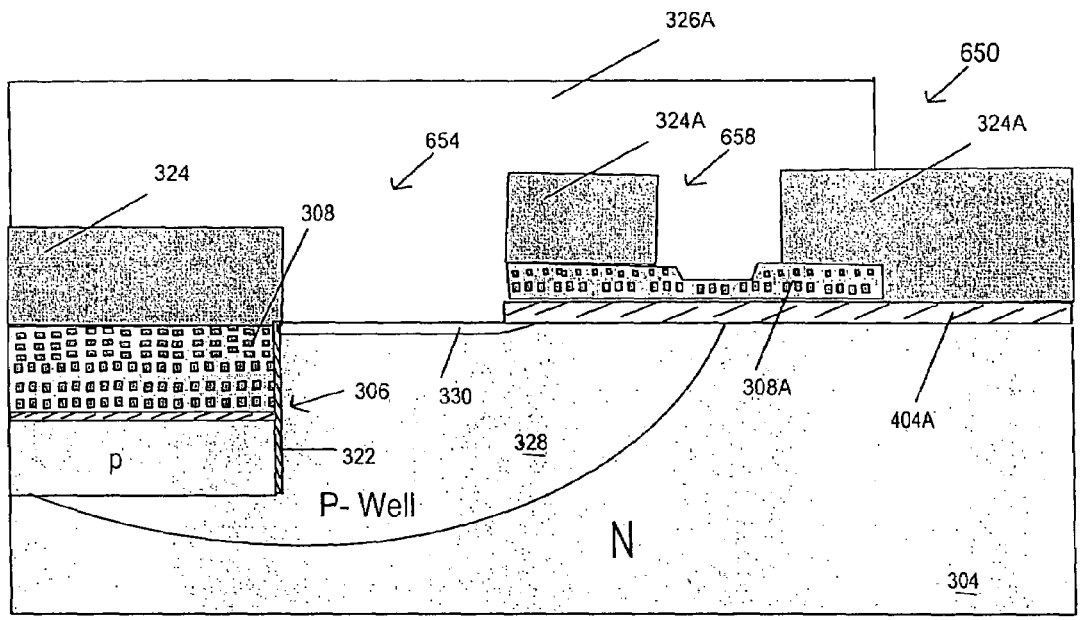
FIG. 10 illustrates a preferred structure of the termination region when the structure of FIG. 3A is used to contact the field shield region.

FIG. 10 shows a termination edge region 650 that may be used with the field shield contact structure shown in FIG. 3A, which contains a P well. A section 404A of oxide layer 404 is left remaining on top of epi layer 304, with an opening 654 adjacent the end of trench 306. This can be done in the seven-mask process illustrated in FIGS. 4A-4H. A heavily-doped N+ polysilicon layer 308A is formed over oxide layer 404A. Polysilicon layer 308A can be a portion of the polysilicon layer that is deposited to form gate 308 (see FIG. 4E) and a mask can be applied before the polysilicon is etched back into the trench to form layer 308A. Using the contact mask, a portion 324A of BPSG layer 324 is left remaining on top of polysilicon layer 308A, with an opening 658 over polysilicon layer 308A. Finally, after metal layer 326 has been patterned, using the metal mask, the portion 326S that contacts the source regions also contacts P+ region 330 and polysilicon layer 308A.

Figure 11:
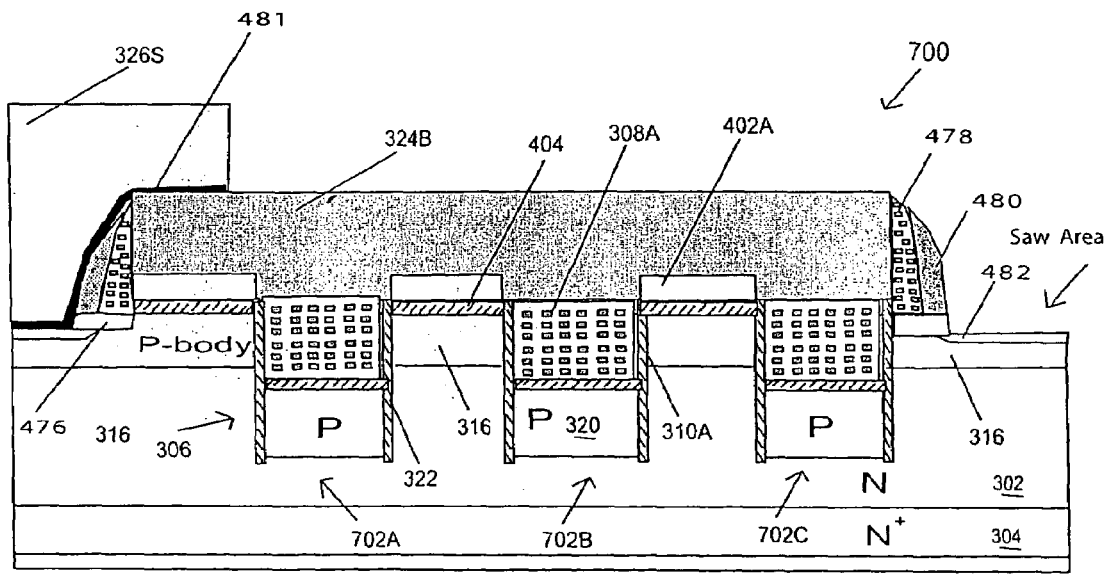
FIG. 11 illustrates a high-voltage termination structure that can be fabricated with three-mask process shown in FIGS. 5A-5G.

If the field shield is contacted in the manner shown in FIG. 9, using a wide trench, a termination structure of the kind shown in FIG. 11 may be employed. In the edge termination region 700, oxide layer 310A, N+ polysilicon layer 308A and three trenches 702A, 702B and 702C are formed by using the trench and contact mask levels. There are no active field plates on the surface of the voltage termination structure shown in FIG. 11, where the process is reduced to three mask levels. The three trenches 702A, 702B and 702C are typically longitudinal trenches that are parallel to each other and are parallel to and adjacent to an edge of the semiconductor die. Trenches 702A-702C may be formed in the same manner and at the same time as trenches 306 in the active region of the MOSFET (see FIG. 5B). The internal structure of trenches 702A-702C is identical to that of trenches 306. Each P-shield region 320 and each polysilicon region 308A "floats" with respect to both source and the drain potentials, because there is no direct electrical contact. Therefore, the three trenches filled with polysilicon 308A, isolated by silicon dioxide layer 310A, act like "floating" p-n junctions (floating rings) with a field plate to reduce the electric field by dividing the voltage among three trenches 702A-702C. Either the P field shield region 320 below each of trenches 702A-702C is in electrical contact with the polysilicon 308A or it is left floating. The contact mask is designed such that a portion 324B of BPSG layer 324 is left over trenches 702A-702C. BPSG layer 324B is removed from the active region of the device side to allow metal layer 326S, which is in contact with the N+ source regions 476, to make contact with P+ region 482. BPSG layer 324B is also removed from the saw street area of the chip (right side of FIG. 11). Polysilicon spacers 478 and BPSG spacers 480 are also shown on the sidewalls of BPSG layer 324B in FIG. 11.

Figure 12A:
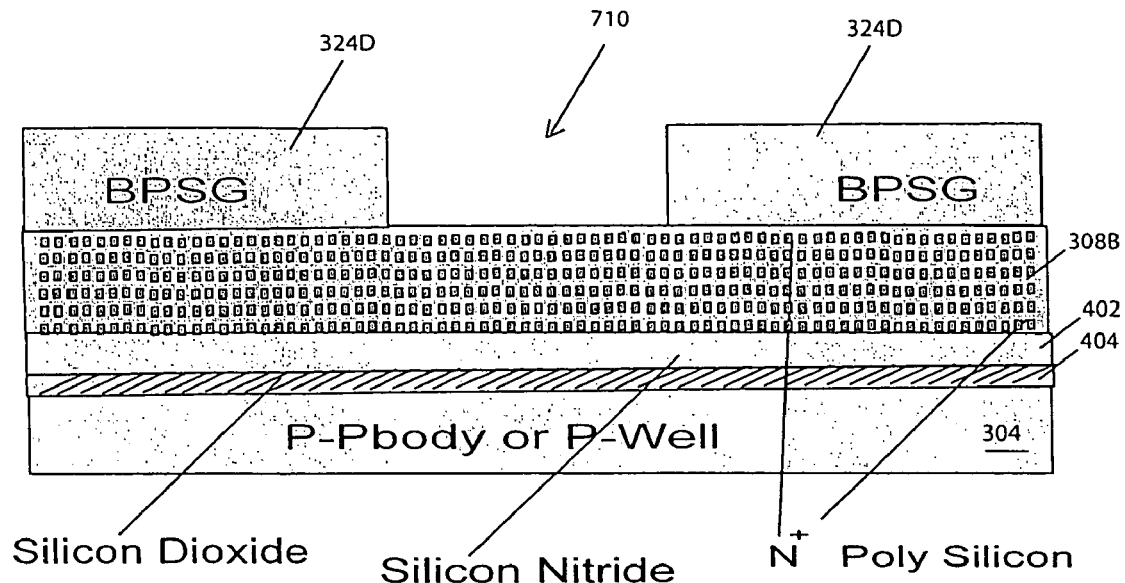
FIGS. 12A and 12B illustrate a preferred structure for contacting the gate of the MOSFET when the MOSFET is manufactured using the process shown in FIGS. 4A-4H.
Figure 12B:
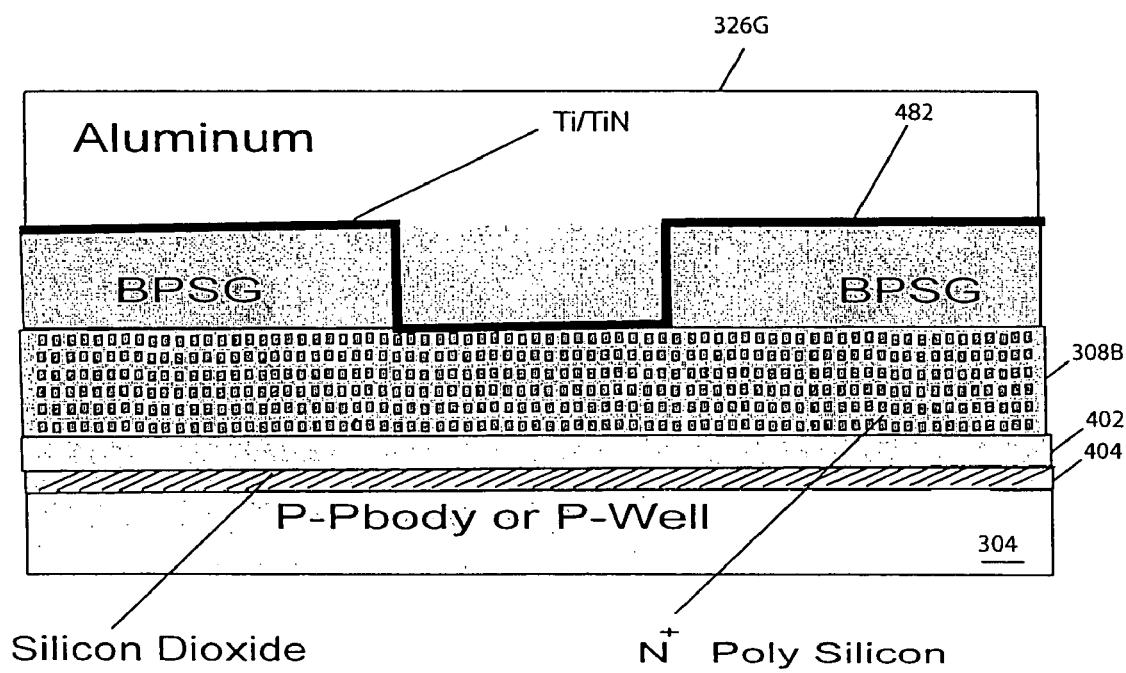

FIGS. 12A and 12B illustrate a structure for contacting the gate 308 when the process shown in FIGS. 4A-4H is used to manufacture the MOSFET. As shown in FIG. 12A, oxide layer 404 and nitride layer 402 are masked so that they are not removed at the point described above (see FIG. 4B). Similarly, when the polysilicon layer which will form gate 308 is deposited, and before it is etched back into the trench, the polysilicon layer is masked in the area where the gate contact is to be made, forming polysilicon layer 308B, which is essentially an extension of gate 308 outside the trench. Polysilicon layer 308B is thus in electrical contact with gate 308. BPSG layer 324 D is an extension of BPSG layer 324. An opening is formed in the contact mask (see FIG. 4G) so that when BPSG layer 324D is etched, an opening 710 is formed. When metal layer 326 is deposited, it fills the opening 710 and makes contact with polysilicon layer 308B. The metal mask is configured such that the section of metal layer 326 that contacts polysilicon layer 308B becomes the gate metal portion 326G.

Figure 13A:
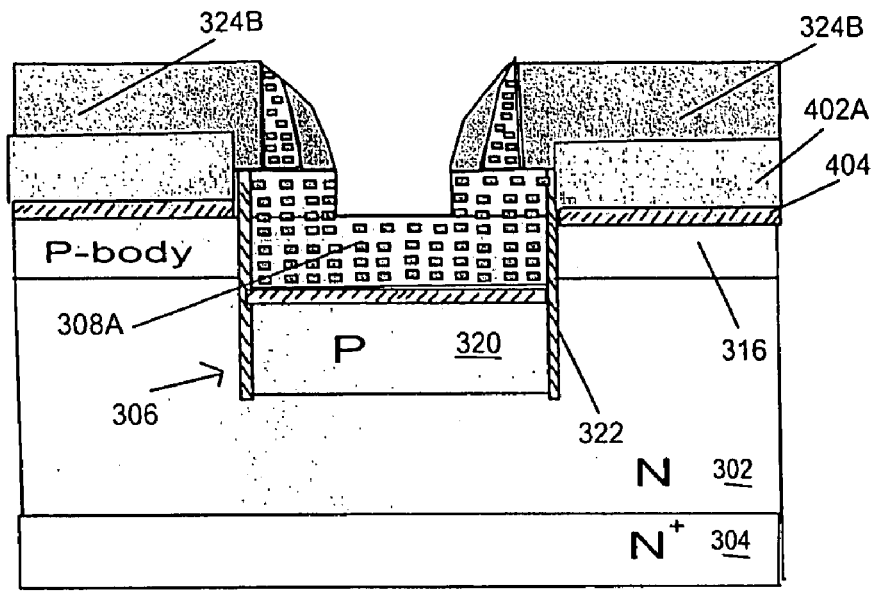
FIGS. 13A and 13B illustrate a preferred structure for contacting the gate of the MOSFET when the MOSFET is manufactured using the process shown in FIGS. 5A-5G.
Figure 13B:
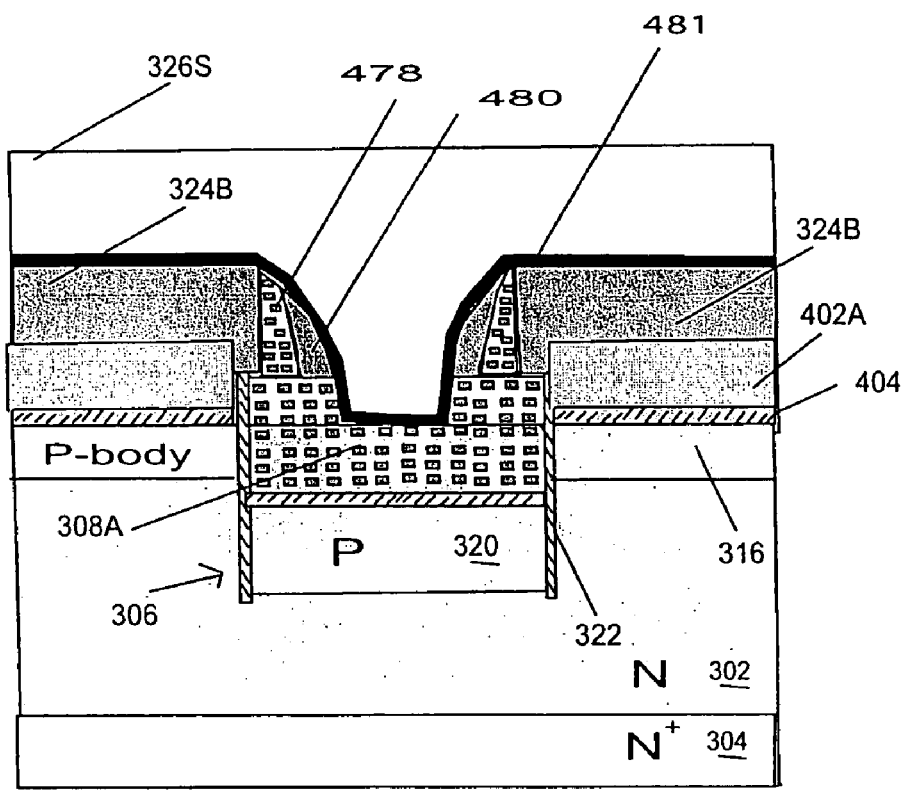

FIGS. 13A and 13B illustrate a way of contacting the gate if the process described in FIGS. 5A-5G is used to manufacture the MOSFET. This process is similar to the one described in FIGS. 5F-5G, except that polysilicon is inside a wider trench repion 306.

Figure 14A:
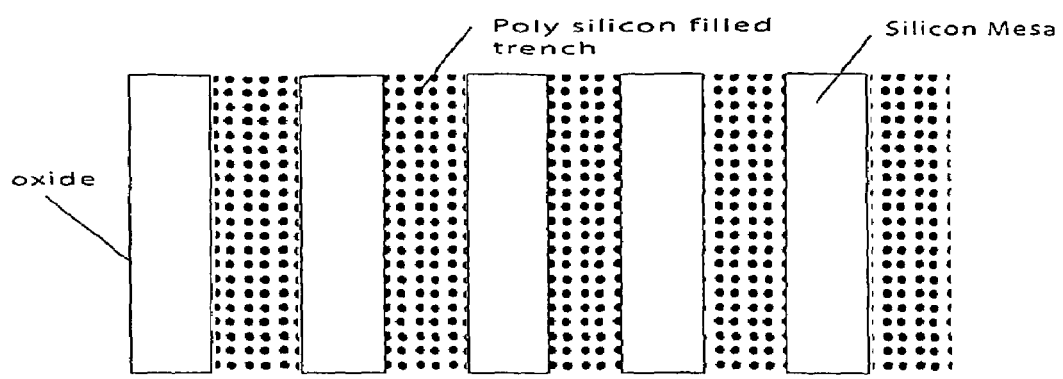
FIGS. 14A-14C illustrate portions of stripe (open cell), square and hexagonal patterns in which the trenches and mesas can be formed in devices according to this invention.
Figure 14B:
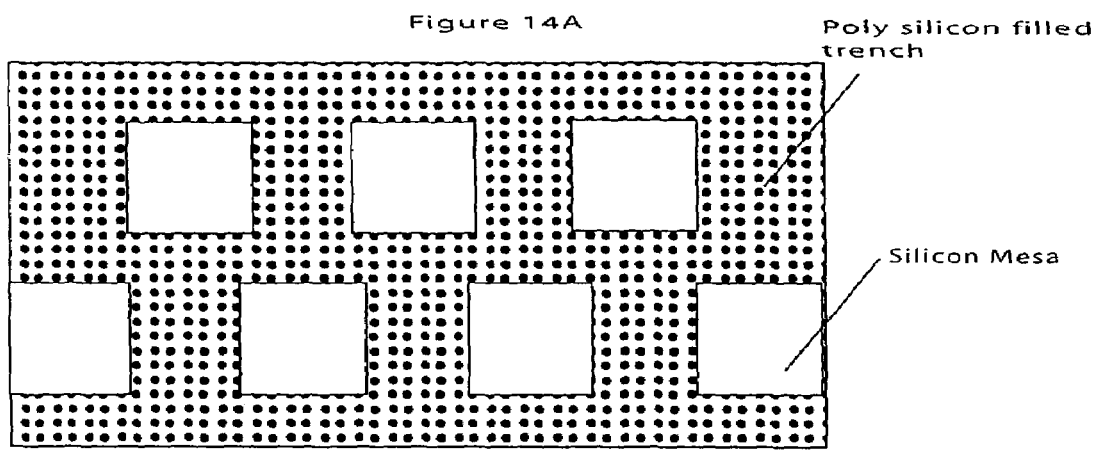
Figure 14C:
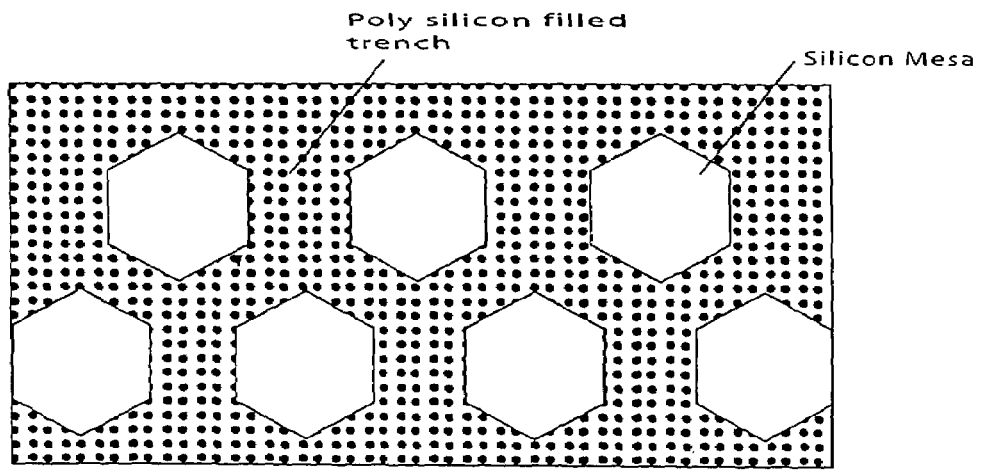

FIGS. 14A-14C illustrate three patterns in which the gate trenches and mesas may be formed: stripe, square and hexagonal geometries. Devices of the present invention may be formed in any of these or other trench layout patterns.

While specific embodiments of this invention have been described, it should be understood that these embodiment are illustrative, and not limiting. Many other embodiments according to this invention will be apparent to persons of skill in the art. For example, while the embodiments described above involved MOSFETs, this invention is also applicable to other semiconductor devices, such as trench insulated gate bipolar transistors (IGBTs), vertical power junction field-effect transistors (JFETs) and power bipolar devices. Moreover, while N-channel devices have been described, the principles of this invention can be used with P-channel devices by reversing the polarities.

I claim:

1. A trench-gated semiconductor device comprising:
a semiconductor substrate of a first conductivity type;
an epitaxial layer formed on the substrate;
first and second trenches formed in the epitaxial layer, said first and second trenches being separated by a mesa;
a gate dielectric layer lining the walls and floor of each of the trenches;
a gate electrode in each of the trenches, the gate electrode being bounded by the gate dielectric layer;
a body region of a second conductivity type in the mesa;
a source region of the first conductivity type adjacent a wall of the trench and the top surface of the epitaxial layer;
a drift region of the epitaxial layer located below the body region and being doped with material of the first conductivity type;
a field shield region of a second conductivity type located below each of the trenches, the lateral sides of the field shield region being bounded by dielectric sidewall spacers, the dielectric sidewall spacers being interposed between the field shield region and the drift region of the epitaxial layer, the field shield region being bounded from below by a PN junction; and
a metal layer on top of the epitaxial layer and in electrical contact with the source region and the body region;
wherein the field shield region is electrically shorted to the source region and the body region.

2. The device of claim 1 wherein the dielectric sidewall spacers comprise silicon dioxide.

3. The device of claim 1 wherein the gate dielectric layer comprises silicon dioxide.

4. The device of claim 1 further comprising a body contact region of the second conductivity type adjacent a top surface of the mesa.

5. The device of claim 1 wherein the field shield region is electrically connected to the source and body regions by means of the metal layer and a well of the second conductivity type.

6. The device of claim 1 wherein said mesa is hexagonal when viewed from above, the device comprising a plurality of said hexagonal mesas.

7. The device of claim 1 wherein said mesa is square when viewed from above, the device comprising a plurality of said square mesas.

8. The device of claim 1 wherein said mesa is circular when viewed from above, the device comprising a plurality of said circular mesas.

9. The device of claim 1 wherein said mesa is in the form of a longitudinal stripe, the device comprising a plurality of said mesas arranged parallel to each other.

10. The device of claim 1 wherein said device is a MOSFET.

11. The device of claim 1 wherein said device is an insulated gate bipolar transistor.

12. A termination region in a power semiconductor device die, said device having at least two terminals, said termination region comprising a region of a first conductivity type, said termination region further comprising:
- a plurality of trenches, said trenches being parallel to an edge of the die, each of said trenches having a sidewall and a floor lined with a dielectric layer, each of said trenches comprising a layer of a conductive material; and
- a field shield region directly below each of said trenches, said field shield region being doped with material of a second conductivity type, said field shield region being bounded laterally by a dielectric spacer and being bounded from below by a PN junction with said region of first conductivity type;
- wherein said conductive material in each trench is in direct electrical contact with the field shield region directly below said trench but there is no direct electrical connection between said conductive material in each trench and said conductive material in the other ones of said trenches or any of said terminals.

13. A device comprising:
- a semiconductor body comprising a region of a first conductivity type;
- a groove formed in the region of first conductivity type;
- a dielectric layer lining the surfaces of the groove;
- a conductive material in the groove, the conductive material being bounded by the dielectric layer; and
- a field shield region of a second conductivity type located below the groove, the lateral sides of the field shield region being bounded by dielectric sidewalls, the dielectric sidewalls being interposed between the field shield region and the region of first conductivity type; the bottom of said field shield region being bounded by PN junction between said field shield region and said region of first conductivity type;
- wherein the field shield region is electrically shorted to an electrode on a top surface of the semiconductor body.

14. A device comprising:
- a semiconductor body comprising a region of a first conductivity type;
- a groove formed in the region of first conductivity type;
- a dielectric layer lining the surfaces of the groove;
- a conductive material in the groove, the conductive material being bounded by the dielectric layer;
- a field shield region of a second conductivity type located below the groove, the lateral sides of the field shield region being bounded by dielectric sidewalls, the dielectric sidewalls being interposed between the field shield region and the region of first conductivity type; the bottom of said field shield region being bounded by PN junction between said field shield region and said region of first conductivity type; and
- a voltage source, the field shield region being electrically shorted to the voltage source.

15. A termination region in a power semiconductor device die, said device having at least two terminals, said termination region comprising a region of a first conductivity type, said termination region further comprising:
- a plurality of trenches, said trenches being parallel to an edge of the die, each of said trenches having a sidewall and a floor lined with a dielectric layer, each of said trenches comprising a layer of a conductive material, said conductive material being insulated from the semiconductor material of the die by said dielectric layer; and
- a field shield region directly below each of said trenches, said field shield region being doped with material of a second conductivity type, said field shield region being bounded laterally by a dielectric spacer and being insulated from said conductive material by said dielectric layer, the field shield region being bounded from below by a PN junction with said region of first conductivity type;
- wherein there is no direct electrical connection between the conductive material in each trench and the conductive material in the other ones of said trenches or any of said terminals.

* * * * *